US011189565B2

(12) United States Patent
Huang

(10) Patent No.: US 11,189,565 B2
(45) Date of Patent: Nov. 30, 2021

(54) SEMICONDUCTOR DEVICE WITH PROGRAMMABLE ANTI-FUSE FEATURE AND METHOD FOR FABRICATING THE SAME

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 51 days.

(21) Appl. No.: 16/794,817

(22) Filed: Feb. 19, 2020

(65) Prior Publication Data

US 2021/0257297 A1    Aug. 19, 2021

(51) Int. Cl.
*H01L 23/525* (2006.01)
*H01L 21/762* (2006.01)

(52) U.S. Cl.
CPC .... *H01L 23/5252* (2013.01); *H01L 21/76224* (2013.01)

(58) Field of Classification Search
CPC ............ H01L 23/49816; H01L 23/5252
USPC .................................. 257/737, 530
See application file for complete search history.

(56) References Cited

U.S. PATENT DOCUMENTS

| 6,396,120 | B1 * | 5/2002 | Bertin | H01L 29/42384 |
| | | | | 257/530 |
| 9,040,370 | B2 * | 5/2015 | Yang | H01L 21/76895 |
| | | | | 438/192 |

FOREIGN PATENT DOCUMENTS

| CN | 106158755 B | 11/2016 |
| CN | 106328504 B | 1/2017 |
| CN | 109390409 A | 2/2019 |
| CN | 110429084 A | 11/2019 |
| JP | 2003115537 A | * 4/2003 |
| TW | 200417039 A | 9/2004 |
| TW | 200931536 A | 7/2009 |
| TW | 201113953 A | 4/2011 |
| TW | 201203320 A | 1/2012 |
| TW | 201403677 A | 1/2014 |
| TW | 201546957 A | 12/2015 |
| TW | 201916358 A | 4/2019 |
| TW | 201919243 A | 5/2019 |
| TW | 201921534 A | 6/2019 |
| TW | I-677095 B | 11/2019 |
| TW | 202005090 A | 1/2020 |

OTHER PUBLICATIONS

Office Action dated Jun. 3, 2021 in TW Application No. 109135361, 11 pages.

* cited by examiner

*Primary Examiner* — Ajay Arora
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a peak portion positioned on the substrate, a gate insulating layer positioned on the peak portion and the substrate, a gate bottom conductive layer positioned on the gate insulating layer, and a first doped region positioned in the substrate and adjacent to one end of the gate insulating layer.

14 Claims, 27 Drawing Sheets

SEMICONDUCTOR DEVICE WITH PROGRAMMABLE ANTI-FUSE FEATURE AND METHOD FOR FABRICATING THE SAME

TECHNICAL FIELD

The present disclosure relates to a semiconductor device and a method for fabricating the semiconductor device, and more particularly, to a semiconductor device with a programmable anti-fuse feature and a method for fabricating the same.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a peak portion positioned on the substrate, a gate insulating layer positioned on the peak portion and the substrate, a gate bottom conductive layer positioned on the gate insulating layer, and a first doped region positioned in the substrate and adjacent to one end of the gate insulating layer.

In some embodiments, the gate insulating layer includes a capping portion positioned on the peak portion and two flat portions positioned adjacent to two sides of the capping portion and on the substrate. A thickness of the two flat portions is greater than or equal to a thickness of the capping portion.

In some embodiments, the semiconductor device includes a plurality of first isolation structures positioned in the substrate. The plurality of first isolation structures define a first active area in the substrate. The first doped region is positioned in the first active area.

In some embodiments, the semiconductor device includes a plurality of gate spacers positioned on sidewalls of the gate bottom conductive layer and sidewalls of the gate insulating layer.

In some embodiments, the semiconductor device includes a first lightly-doped region positioned in the first active area and adjacent to the one end of the gate insulating layer.

In some embodiments, the semiconductor device includes a gate top conductive layer positioned on the gate bottom conductive layer and a first conductive layer positioned on the first doped region. A thickness of the gate top conductive layer is between about 2 nm and about 20 nm and a thickness of the first conductive layer between about 2 nm and about 20 nm.

In some embodiments, the semiconductor device includes a first contact positioned on the gate top conductive layer and a second contact positioned on the first conductive layer.

In some embodiments, the semiconductor device includes a first insulating layer positioned on the substrate and a second insulating layer positioned on the first insulating layer. The first contact is positioned in the second insulating layer and the second contact is positioned penetrating the second insulating layer and the first insulating layer.

In some embodiments, the semiconductor device includes a first barrier layer positioned between the first contact and the second insulating layer and between the first contact and the gate top conductive layer.

In some embodiments, the semiconductor device includes a first etch stop layer positioned between the first insulating layer and the second insulating layer.

In some embodiments, the semiconductor device includes a first stress region positioned between the first doped region and the second contact.

In some embodiments, a porosity of the second insulating layer is between about 10% and about 50%.

Another aspect of the present disclosure provides a semiconductor device including a substrate, a first well region positioned in the substrate, a first isolation structure positioned in the first well region, a second isolation structure and a third isolation structure respectively positioned adjacent to two sides of the first well region, a peak portion, a gate insulating layer, a gate bottom conductive layer, a doped region, a first contact, and a second contact. The first isolation structure and the second isolation structure define a first active area in the substrate. The first isolation structure and the third isolation structure define a second active area in the substrate. The second active area is opposite to the first active area with the first isolation structure interposed therebetween. The peak portion is positioned on the first active area. The gate insulating layer is positioned on the peak portion and the substrate. The gate bottom conductive layer is positioned on the gate insulating layer. The doped region is positioned in the second active area. The first contact is positioned above the gate bottom conductive layer. The second contact is positioned above the second doped region.

In some embodiments, a depth of the first isolation structure is less than a depth of the second isolation structure or less than a depth of the third isolation structure.

Another aspect of the present disclosure provides a method for fabricating a semiconductor device including providing a substrate, forming a peak portion on the substrate, forming a gate insulating layer on the substrate and the peak portion, forming a gate bottom conductive layer on the gate insulating layer, and forming a first doped region in the substrate and adjacent to one end of the gate insulating layer.

In some embodiments, the method for fabricating the semiconductor device includes forming a plurality of first isolation structures in the substrate. The plurality of first isolation structures define a first active area and the first doped region is formed in the first active area.

In some embodiments, the method for fabricating the semiconductor device includes forming a gate top conductive layer on the gate bottom conductive layer.

In some embodiments, forming the gate top conductive layer on the gate bottom conductive layer includes forming a layer of a second conductive material over the gate bottom conductive layer, performing a thermal treatment on the semiconductor device, and performing a clean process on the semiconductor device. The second conductive material includes titanium, nickel, platinum, tantalum, or cobalt.

In some embodiments, the thermal treatment is a dynamic surface annealing process.

Due to the design of the semiconductor device of the present disclosure, the rupture point of the gate insulating layer may be easily limited in the place adjacent to the vertex of the peak portion. As a result, the reliability of programming of the semiconductor device may be increased. In addition, the presence of the first stress region may increase the carrier mobility of the semiconductor device. Thus, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
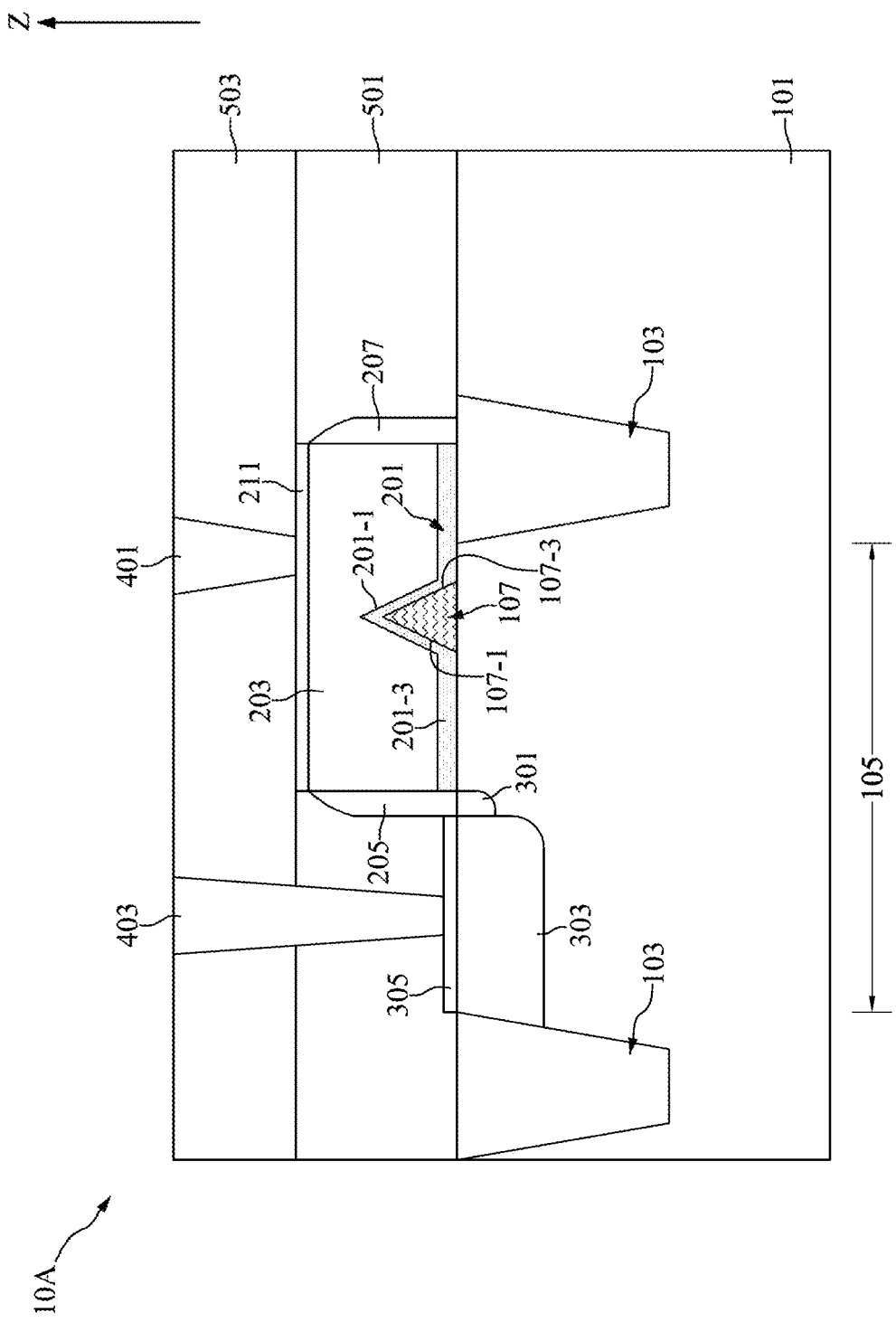
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

In the present disclosure, a semiconductor device generally means a device which can function by utilizing semiconductor characteristics, and an electro-optic device, a light-emitting display device, a semiconductor circuit, and an electronic device are all included in the category of the semiconductor device.

Figure 2:
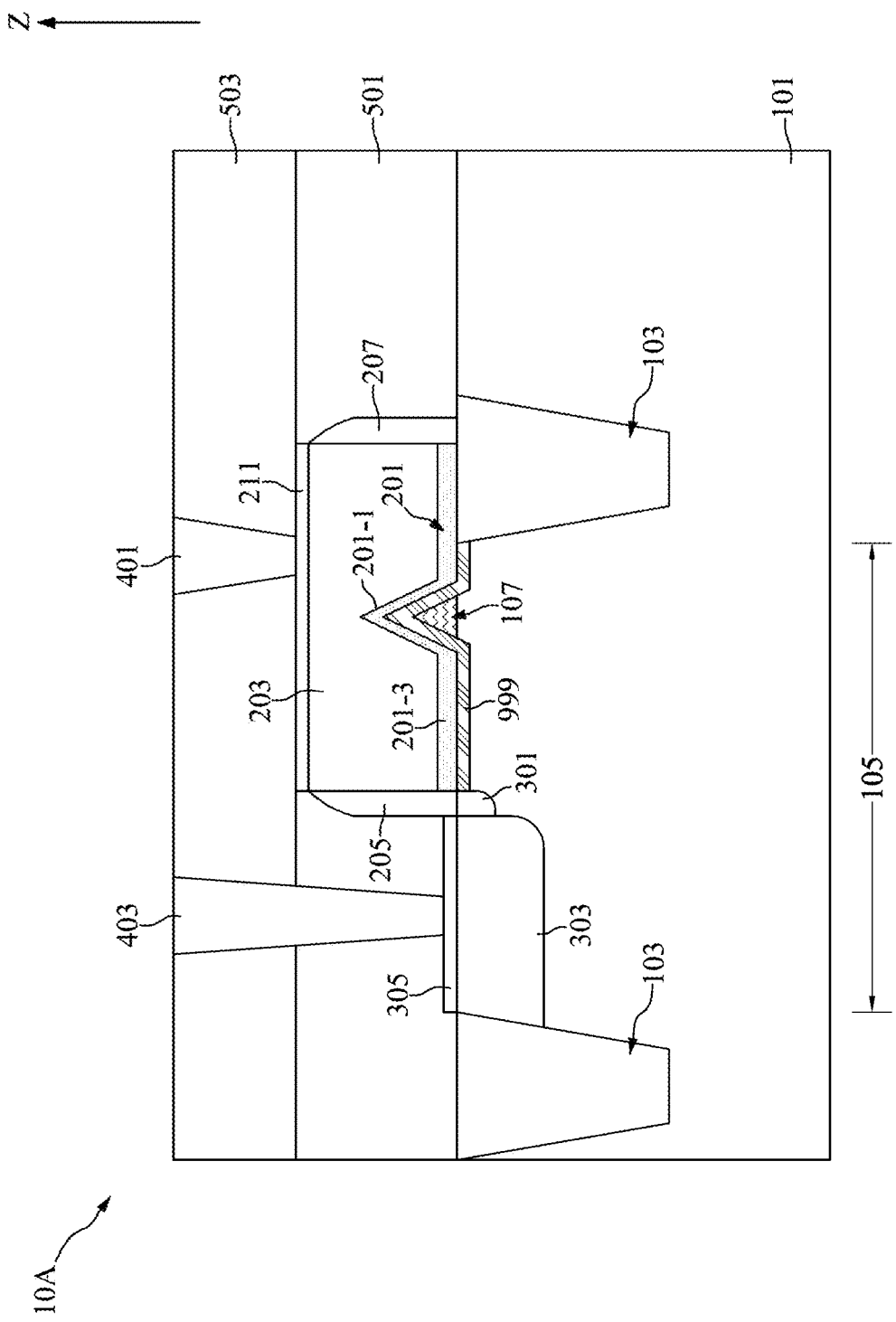
FIG. 2 illustrates, in a schematic cross-sectional diagram, the semiconductor device during programming in accordance with one embodiment of the present disclosure.

FIG. 1 illustrates, in a schematic cross-sectional diagram, a semiconductor device 10A in accordance with one embodiment of the present disclosure. FIG. 2 illustrates, in a schematic cross-sectional diagram, the semiconductor device 10A during programming in accordance with one embodiment of the present disclosure.

With reference to FIG. 1, in the embodiment depicted, the semiconductor device 10A may include a substrate 101, a plurality of first isolation structures 103, a peak portion 107, a gate insulating layer 201, a gate bottom conductive layer 203, a plurality of gate spacers, a gate top conductive layer 211, a first lightly-doped region 301, a first doped region 303, a first conductive layer 305, a first contact 401, a second contact 403, a first insulating layer 501, and a second insulating layer 503.

With reference to FIG. 1, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant and a crystal orientation <100>. In some embodiments, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIG. 1, the plurality of first isolation structures 103 may be disposed in the substrate 101. The plurality of first isolation structures 103 may define a first active area 105 in the substrate 101. The plurality of first isolation structures 103 may be formed of, for example, an insulating material such as silicon oxide, silicon nitride, silicon oxynitride, silicon nitride oxide, or fluoride-doped silicate.

It should be noted that the first active area 105 may include a portion of the substrate 101 and a space above the portion of the substrate 101. Describing an element as being disposed on the first active area 105 means that the element is disposed on a top surface of the portion of the substrate 101. Describing an element as being disposed in the first active area 105 means that the element is disposed in the portion of the substrate 101; however, a top surface of the element may be even with the top surface of the portion of the substrate 101. Describing an element as being disposed above the first active area 105 means that the element is disposed above the top surface of the portion of the substrate 101.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, the first insulating layer 501 may be disposed on the substrate 101. The second insulating layer 503 may be disposed on the first insulating layer 501. The first insulating layer 501 and the second insulating layer 503 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, amorphous fluorinated carbon, organo silicate glass, or a combination thereof, but are not limited thereto. The first insulating layer 501 and the second insulating layer 503 may be formed of different materials, but are not limited thereto.

In some embodiments, the first insulating layer 501 and the second insulating layer 503 may have a porosity between about 10% and about 50%. The first insulating layer 501 and the second insulating layer 503 may be formed from an energy-removable material, as will be illustrated later. The first insulating layer 501 and the second insulating layer 503 may include a skeleton and a plurality of empty spaces disposed among the skeleton. The plurality of empty spaces may connect to each other and may be filled with air. The skeleton may include, for example, silicon oxide or methylsilsesquioxane. The plurality of empty spaces of the first insulating layer 501 and the second insulating layer 503 may be filled with air. As a result, a dielectric constant of the first insulating layer 501 and the second insulating layer 503 may be significantly lower than an insulating layer formed of only silicon oxide. Therefore, the first insulating layer 501 and the second insulating layer 503 may significantly reduce the parasitic capacitance of adjacent conductive features disposed therein. That is, the first insulating layer 501 and the second insulating layer 503 having a porosity between about 10% and about 50% may significantly alleviate an interference effect between electrical signals induced or applied to the semiconductor device 10A.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. The energy source may include heat, light, or a combination thereof. The base material may include a methylsilsesquioxane based material or silicon oxide. The decomposable porogen material may include a porogen organic compound that provides porosity to the base material of the energy-removable material. In some embodiments, the energy-removable material may include about 50% or greater of the base material, and about 50% or less of the decomposable porogen material. In some embodiments, the energy-removable material may include about 90% or greater of the base material, and about 10% or less of the decomposable porogen material.

With reference to FIG. 1, the peak portion 107 may be disposed on the first active area 105 and in the first insulating layer 501. The peak portion 107 may have a cross-sectional profile which is triangular in shape and may include a first faceted plane 107-1 and a second faceted plane 107-3 intersecting each other. An angle between a top surface of the substrate 101 and the first faceted plane 107-1 may be between about 50 degrees and about 60 degrees. The first faceted plane 107-1 and the second faceted plane 107-3 may have a crystal orientation <111>. In some embodiments, the peak portion 107 may have cross-sectional profile having a diamond shape, a pentagonal shape, or a shape having more than five sides. The peak portion 107 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials.

With reference to FIG. 1, the gate insulating layer 201 may be disposed on the peak portion 107 and the substrate 101. The gate insulating layer 201 may be disposed in the first insulating layer 501. The gate insulating layer 201 may include a capping portion 201-1 and two flat portions 201-3. The capping portion 201-1 may be disposed on the first faceted plane 107-1 and the second faceted plane 107-3. The two flat portions 201-3 may be respectively correspondingly connected to two ends of the capping portion 201-1. The two flat portions 201-3 may be disposed on the substrate 101. A portion of one of the two flat portions 201-3 may be disposed on one of the plurality of first isolation structures 103. A thickness of the two flat portions 201-3 may be greater than or equal to a thickness of the capping portion 201-1. In some embodiments, the thickness of the two flat portions 201-3 may be greater than the thickness of the capping portion 201-1.

In some embodiments, the gate insulating layer 201 may be formed of, for example, silicon oxide. In some embodiments, the gate insulating layer 201 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the gate insulating layer 201 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the gate insulating layer 201 may be a multilayer structure that includes, for example, one layer of silicon oxide and another layer of high-k dielectric material.

With reference to FIG. 1, the gate bottom conductive layer 203 may be disposed on the gate insulating layer 201 and in the first insulating layer 501. The gate bottom conductive layer 203 may be formed of, for example, a conductive material such as polycrystalline silicon, polycrystalline silicon germanium, or a combination thereof. In some embodiments, the gate bottom conductive layer 203 may be doped with a dopant such as phosphorus, arsenic, antimony, or boron.

With reference to FIG. 1, the plurality of gate spacers may be disposed on sidewalls of the gate bottom conductive layer 203 and sidewalls of the gate insulating layer 201. The plurality of gate spacers may be disposed in the first insulating layer 501. The plurality of gate spacers may include a first gate spacer 205 and a second gate spacer 207. The first gate spacer 205 may be disposed on the first active area 105 and attached to one of the sidewalls of the gate bottom conductive layer 203 and a sidewall of another one of the two flat portions 201-3. The second gate spacer 207 may be disposed on the one of the plurality of first isolation structures 103 and attached to another sidewall of the gate bottom conductive layer 203 and a sidewall of the one of the two flat portions 201-3. The plurality of gate spacers may be formed of, for example, silicon oxide, silicon nitride, or the like.

With reference to FIG. 1, the gate top conductive layer 211 may be disposed on the gate bottom conductive layer 203 and in the first insulating layer 501. The gate top conductive layer 211 may have a thickness between about 2 nm and about 20 nm. The gate top conductive layer 211 may be formed of, for example, titanium silicide, nickel silicide, nickel platinum silicide, tantalum silicide, or cobalt silicide.

With reference to FIG. 1, the first lightly-doped region 301 may be disposed below the first gate spacer 205 and in the first active area 105. The first lightly-doped region 301 may be opposite to the one of the plurality of first isolation structures 103. In some embodiments, the first lightly-doped region 301 may be doped with a dopant such as phosphorus, arsenic, or antimony and may have a first electrical type. In some embodiments, the first lightly-doped region 301 may be doped with a dopant such as boron and may have a second electrical type.

With reference to FIG. 1, the first doped region 303 may be disposed in the first active area 105 and adjacent to the first lightly-doped region 301. The first doped region 303 may be disposed between the first lightly-doped region 301 and another one of the plurality of first isolation structures 103. In other words, the first doped region 303 may be opposite to the one of the plurality of first isolation structures 103. The first doped region 303 may have a same electrical type as the first lightly-doped region 301 and may be doped with a dopant such as phosphorus, arsenic, antimony, or boron. The first doped region 303 may have a dopant concentration greater than a dopant concentration of the first lightly-doped region 301.

With reference to FIG. 1, the first conductive layer 305 may be disposed on the first doped region 303 and in the first insulating layer 501. The first conductive layer 305 may have a same thickness as the gate top conductive layer 211, but is not limited thereto. The first conductive layer 305 may be formed of a same material as the gate top conductive layer 211, but is not limited thereto.

With reference to FIG. 1, the first contact 401 may be disposed on the gate top conductive layer 211 and in the second insulating layer 503. The second contact 403 may be disposed on the first conductive layer 305 and penetrates the second insulating layer 503 and the first insulating layer 501. In some embodiments, the sidewalls of the first contact 401 and the sidewalls of the second contact 403 may have a slanted cross-sectional profile. In some embodiments, a width of the first contact 401 or a width of the second contact 403 may gradually increase from bottom to top along the direction Z. In some embodiments, sidewalls of the second contact 403 or sidewalls of the first contact 401 as a whole may have a uniform slope. The first contact 401 and the second contact 403 may be used to apply a programming voltage or current to the semiconductor device 10A.

During programming of the semiconductor device 10A, a programming voltage may be provided and applied to the semiconductor device 10A, and a channel region 999 may be formed as shown in FIG. 2. A programming current may flow through the channel region 999 and heat the area around the channel region 999. During programming of the semiconductor device 10A, the vertex of the peak portion 107 may be the most vulnerable part of the peak portion 107 because electrical fields concentrate at the sharp profile. Since the vertex of the peak portion 107 may obtain the greatest electrical fields, the gate insulating layer 201 may be broken down to form a rupture point of the gate insulating layer 201 adjacent to the vertex of the peak portion 107 and a resistance reduction may be induced accordingly. Consequently, the semiconductor device 10A is blown and programmed. The position of the rupture point of the gate insulating layer 201 may be easily limited in the place adjacent to the vertex of the peak portion 107 having the greatest electrical fields during programming. As result, the reliability of programming of the semiconductor device 10A may be increased.

FIGS. 3 to 6 illustrate, in schematic cross-sectional diagrams, semiconductor devices 10B, 10C, 10D, and 10E in accordance with embodiments of the present disclosure. FIG. 7 illustrates, in a schematic cross-sectional diagram, the semiconductor device 10E during programming in accordance with one embodiment of the present disclosure.

Figure 3:
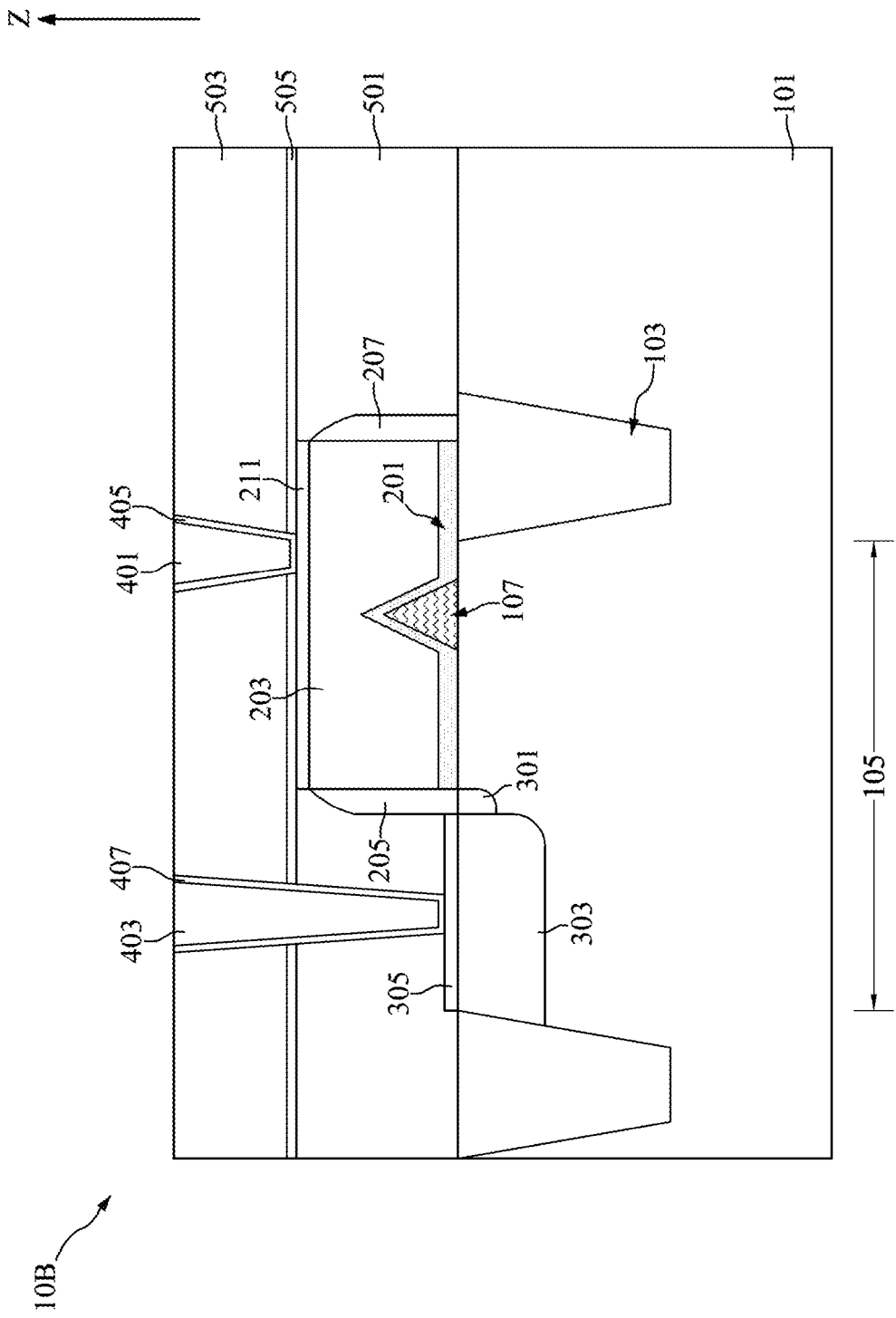
FIGS. 3 to 6 illustrate, in schematic cross-sectional diagrams, semiconductor devices in accordance with embodiments of the present disclosure.

With reference to FIG. 3, the semiconductor device 10B may include a first barrier layer 405, a second barrier layer 407, and a first etch stop layer 505. The first barrier layer 405 may be disposed between the first contact 401 and the second insulating layer 503 and between the first contact 401 and the gate top conductive layer 211. The first barrier layer 405 may serve as a protective layer for protecting its underlying structure (e.g., the gate top conductive layer 211) during formation of the first contact 401. The first barrier layer 405 may also serve as an adhesive layer between the first contact 401 and the gate top conductive layer 211.

With reference to FIG. 3, the second barrier layer 407 may be disposed between the second contact 403 and the second insulating layer 503 and between the second contact 403 and the first conductive layer 305. The second barrier layer 407 may serve as a protective layer for protecting its underlying structure (e.g., the first conductive layer 305) during formation of the second contact 403. The second barrier layer 407 may also serve as an adhesive layer between the second contact 403 and the first conductive layer 305. The first barrier layer 405 and the second barrier layer 407 may be formed of, for example, titanium, titanium nitride, titanium silicon nitride, tantalum, tantalum nitride, tantalum silicon nitride, or a combination thereof. The first barrier layer 405 and the second barrier layer 407 may be formed of a same material, but are not limited thereto.

With reference to FIG. 3, the first etch stop layer 505 may be disposed between the first insulating layer 501 and the second insulating layer 503. The first etch stop layer 505 may be formed of, for example, carbon-doped oxide, carbon incorporated silicon oxide, ornithine decarboxylase, or nitrogen-doped silicon carbide.

Figure 4:
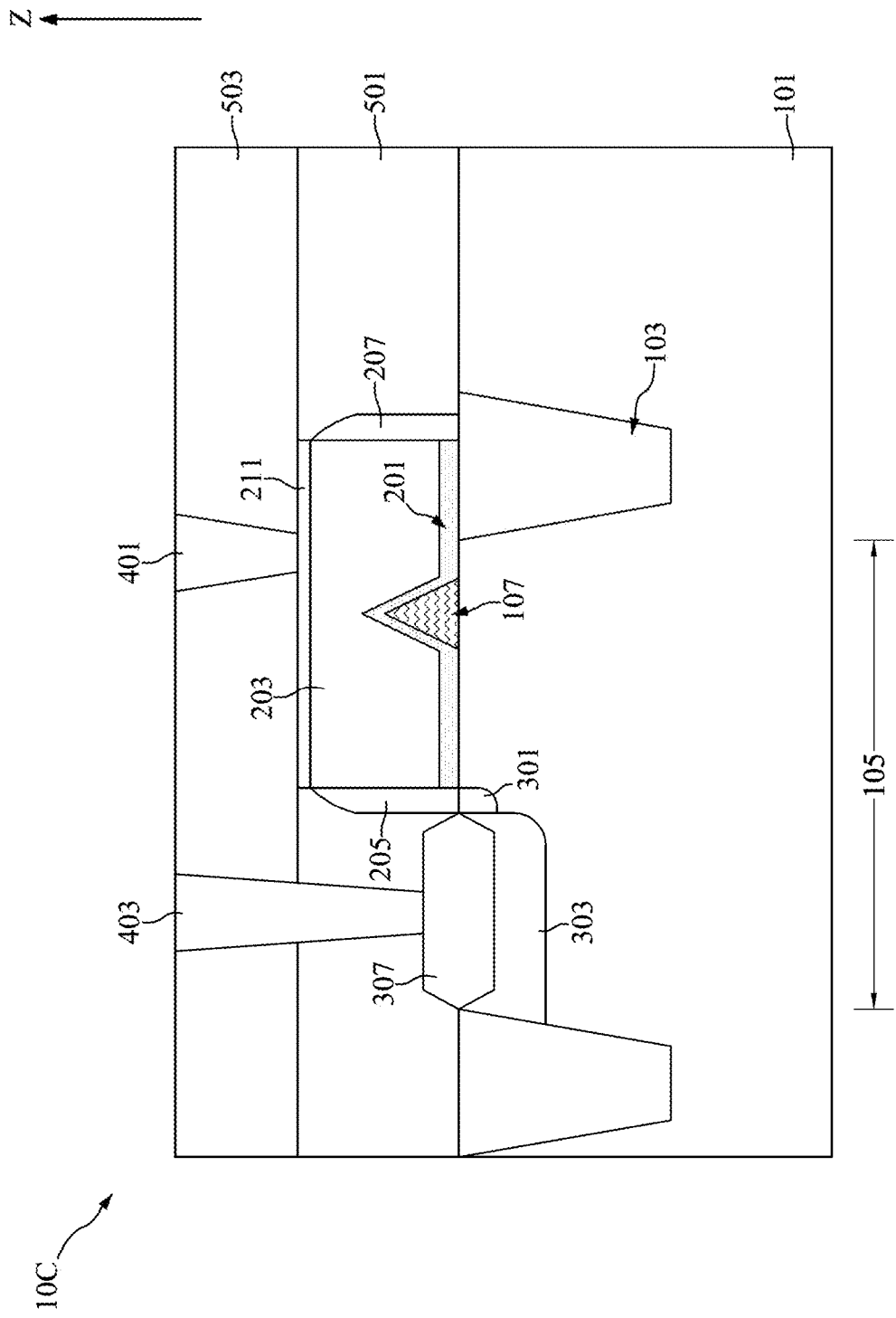

With reference to FIG. 4, the semiconductor device 10C may include a first stress region 307. The first stress region 307 may be disposed between the second contact 403 and the first doped region 303. A lower portion of the first stress region 307 may be disposed in the first doped region 303. An upper portion of the first stress region 307 may protrude from the top surface of the substrate 101 and may be disposed in the first insulating layer 501. The first stress region 307 may be formed of, for example, silicon germanium or silicon carbide. The first stress region 307 may have a second lattice constant which is different from the first lattice constant of the substrate 101. The second lattice constant of the first stress region 307 is different from the first lattice constant of the substrate 101; therefore, the carrier mobility of the semiconductor device 10C may be increased, and the performance of the semiconductor device 10C may be improved.

Figure 5:
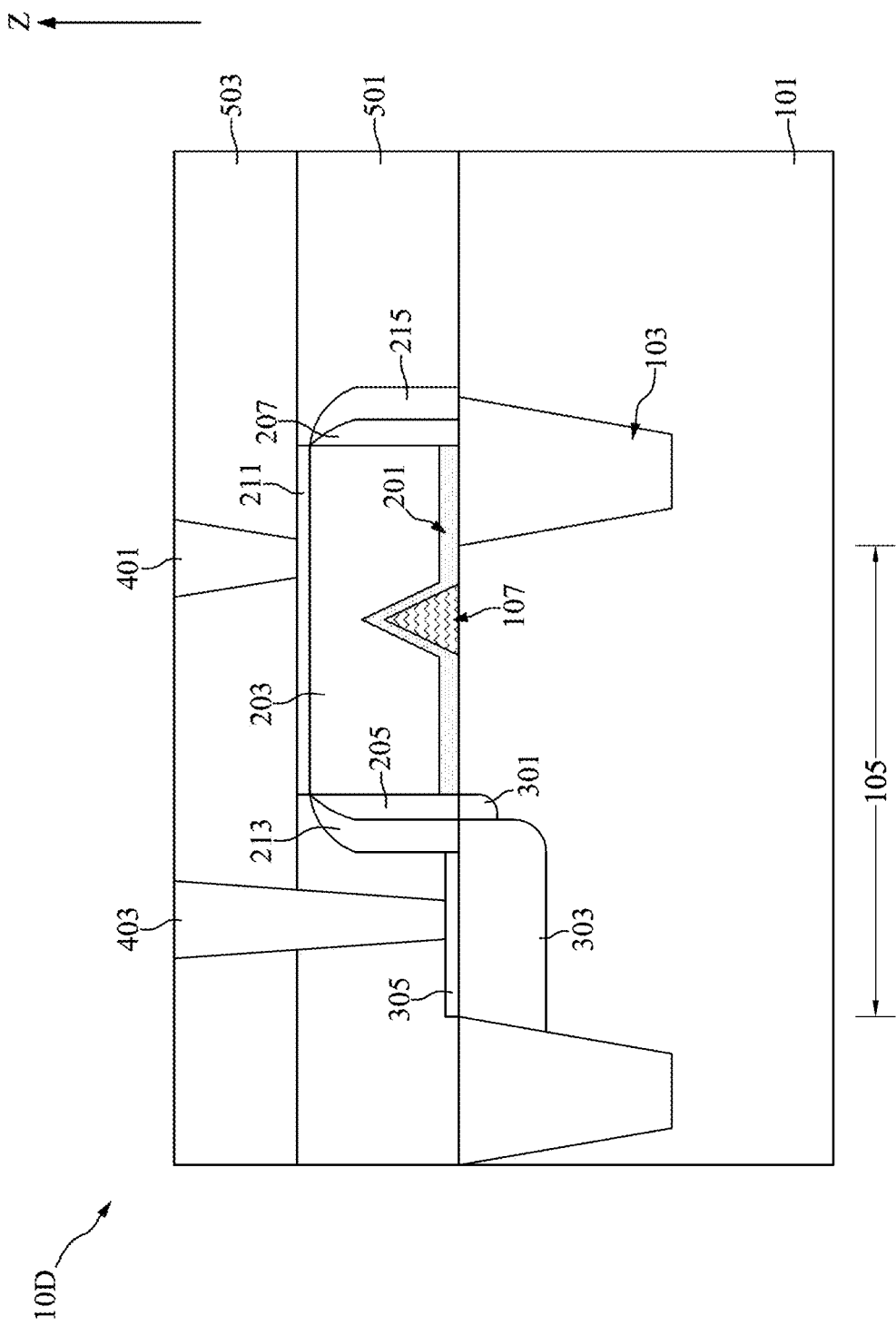

With reference to FIG. 5, the semiconductor device 10D may include a third gate spacer 213 and a fourth gate spacer 215. The first gate spacer 205 and the second gate spacer 207 may be formed of, for example, silicon oxide, silicon nitride, or polysilicon. The third gate spacer 213 may be disposed on the sidewall of the first gate spacer 205 and in the first insulating layer 501. The fourth gate spacer 215 may be disposed on the sidewall of the second gate spacer 207 and in the first insulating layer 501. The third gate spacer 213 and the fourth gate spacer 215 may be formed of, for example, silicon oxide. Due to the presence of the third gate spacer 213 and the fourth gate spacer 215, a thickness of the first gate spacer 205 or a thickness of the second gate spacer 207 may be minimized, thereby reducing overlap capacitance formed between the first doped region 303 and the gate bottom conductive layer 203.

Figure 6:
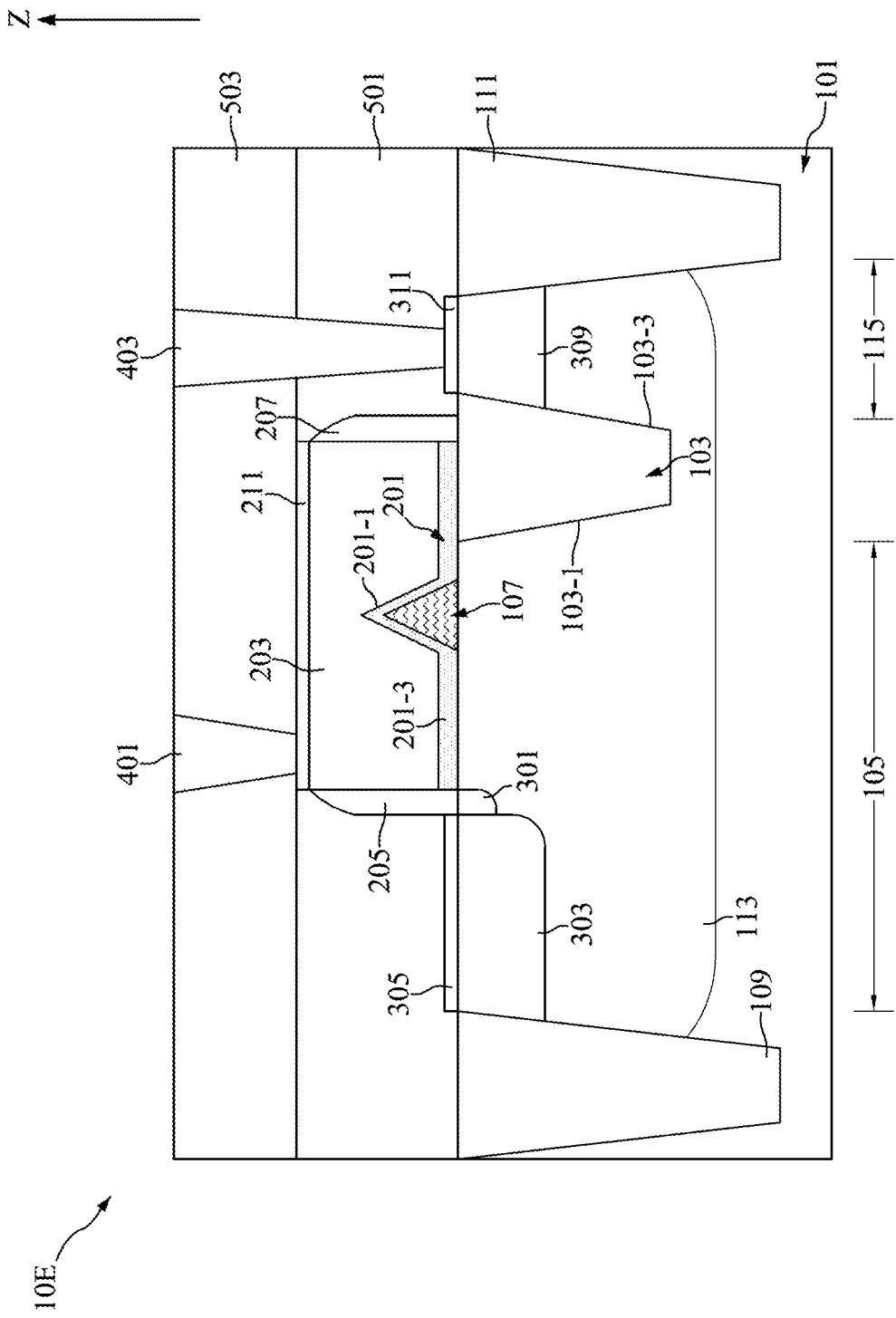
Figure 7:
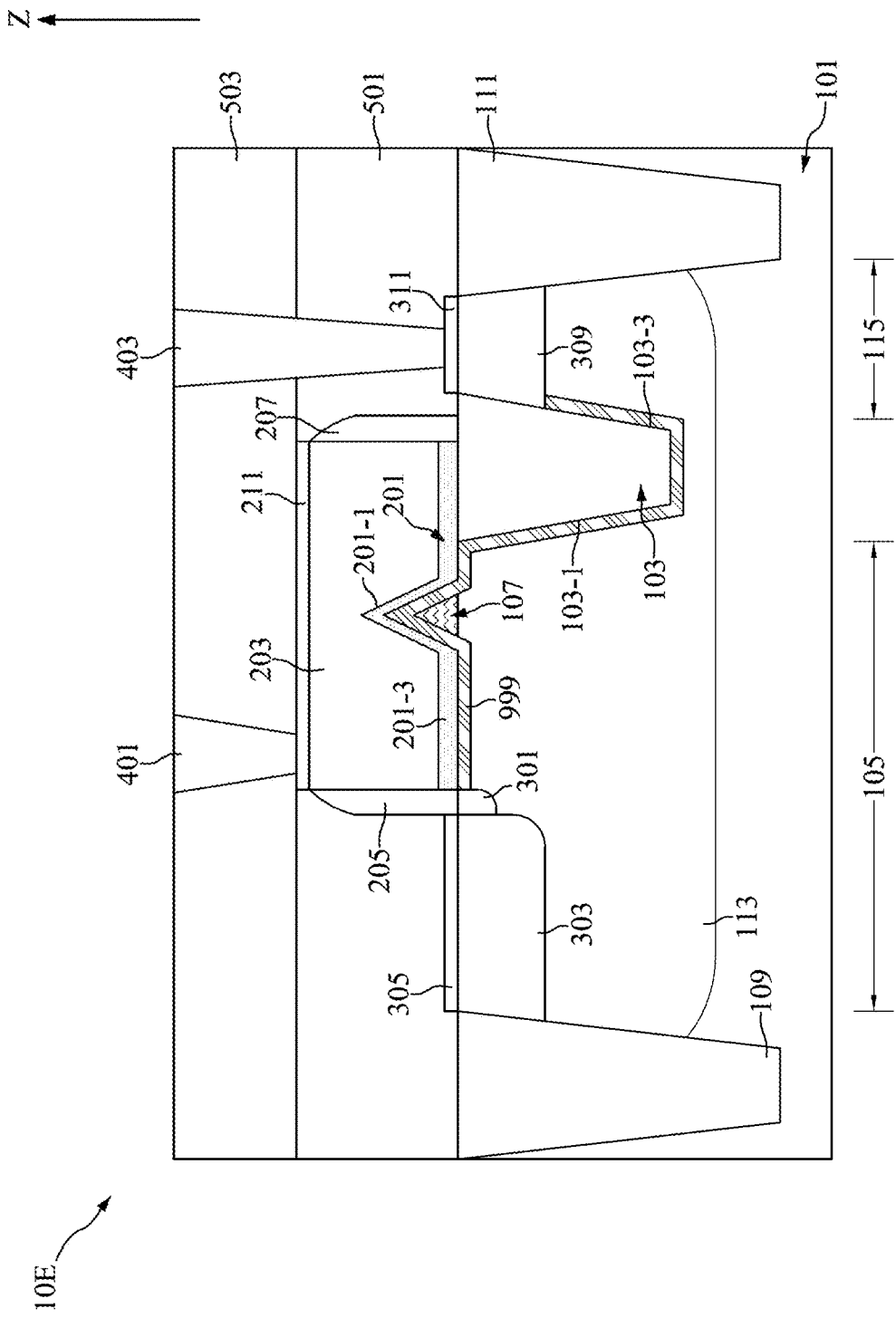
FIG. 7 illustrates, in a schematic cross-sectional diagram, the semiconductor device during programming in accordance with one embodiment of the present disclosure.

With reference to FIG. 6, in the semiconductor device 10E, the second isolation structure 109 and the third isolation structure 111 may be disposed in the substrate 101. The first well region 113 may be disposed between the second isolation structure 109 and the first well region 113. The first well region 113 may be doped with a dopant such as phosphorus, arsenic, or antimony and may have the first electrical type. In some embodiments, the first well region 113 may be doped with a dopant such as boron and may have the second electrical type.

With reference to FIG. 6, the first isolation structure 103 may be disposed in the first well region 113. A depth of the first isolation structure 103 may be less than a depth of the second isolation structure 109 or a depth of the third isolation structure 111. The first isolation structure 103 and the second isolation structure 109 may define the first active area 105. The first isolation structure 103 and the third isolation structure 111 may define the second active area 115. The second active area 115 may be opposite to the first active area 105 with the first isolation structure 103 interposed therebetween. The second isolation structure 109 and the third isolation structure 111 may be formed of a same material as the first isolation structure 103, but are not limited thereto.

With reference to FIG. 6, the first insulating layer 501 may be disposed on the substrate 101. The second insulating layer 503 may be disposed on the first insulating layer 501. The peak portion 107 may be disposed on the first active area 105. The gate insulating layer 201 may be disposed on the peak portion 107 and the substrate 101. The gate bottom conductive layer 203 may be disposed on the gate insulating layer 201. The first gate spacer 205 and the second gate spacer 207 may be respectively correspondingly disposed on the sidewalls of the gate bottom conductive layer 203 and the sidewalls of the gate insulating layer 201. The gate top conductive layer 211 may be disposed on the gate bottom conductive layer 203.

With reference to FIG. 6, the first lightly-doped region 301 may be disposed below the first gate spacer 205 and in the first active area 105. The first lightly-doped region 301 may be opposite to the first isolation structure 103. The first doped region 303 may be disposed in the first active area 105 and adjacent to the first lightly-doped region 301. The first doped region 303 may be disposed between the first lightly-doped region 301 and the second isolation structure 109. The first doped region 303 may be opposite to the first isolation structure 103. The first lightly-doped region 301, the first doped region 303, and the first well region 113 may have a same electrical type.

With reference to FIG. 6, the first conductive layer 305 may be disposed on the first doped region 303. The second doped region 309 may be disposed in the second active area 115. The second doped region 309 may be opposite to the first active area 105 with the first isolation structure 103 interposed therebetween. The second doped region 309 may be doped with a dopant such as phosphorus, arsenic, or antimony and have the first electrical type. In some embodiments, the second doped region 309 may be doped with a dopant such as boron and have the second electrical type. The second doped region 309 may have a same electrical type as the first doped region 303 or the first well region 113. The second conductive layer 311 may be disposed on the second doped region 309 and in the first insulating layer 501. The second conductive layer 311 may have a same thickness as the gate top conductive layer 211. The second conductive layer 311 may be formed of a same material as the gate top conductive layer 211.

With reference to FIG. 6, the first contact 401 may be disposed on the gate top conductive layer 211 and adjacent to the first gate spacer 205. The second contact 403 may be disposed on the second conductive layer 311. In other words, the first contact 401 and the second contact 403 may be disposed on opposite sides of the first isolation structure 103.

With reference to FIG. 7, during programming of the semiconductor device 10E, the programming current may flow between the first contact 401 and the second contact 403. However, the first contact 401 and the second contact 403 may be disposed on opposite sides of the first isolation structure 103 (e.g., the first side 103-1 and the second side 103-3). Hence, the channel region 999 of the programming current may extend through the first active area 105 proximate to the first side 103-1 of the first isolation structure 103, along the bottom surface of the first isolation structure 103, and into the second active area 115 proximate to the second side 103-3 of the first isolation structure 103. As a result, the channel region 999 may cause an increase in the heat generated by the programming current, and this increase in heat may decrease the time need to accurately program the semiconductor device 10E. In addition, the doping profile of the first well region 113 can be well defined and controlled, and the resistance of the first well region 113 may be consistent. Hence, the semiconductor device 10E may render more stable heat generation during programming and reduced variation in the resistance after programming.

It should be noted that, due to the presence of the first lightly-doped region 301 and the first doped region 303, the channel region 999 may extend to the first lightly-doped region 301 during the programming of the semiconductor device 10E.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 8:
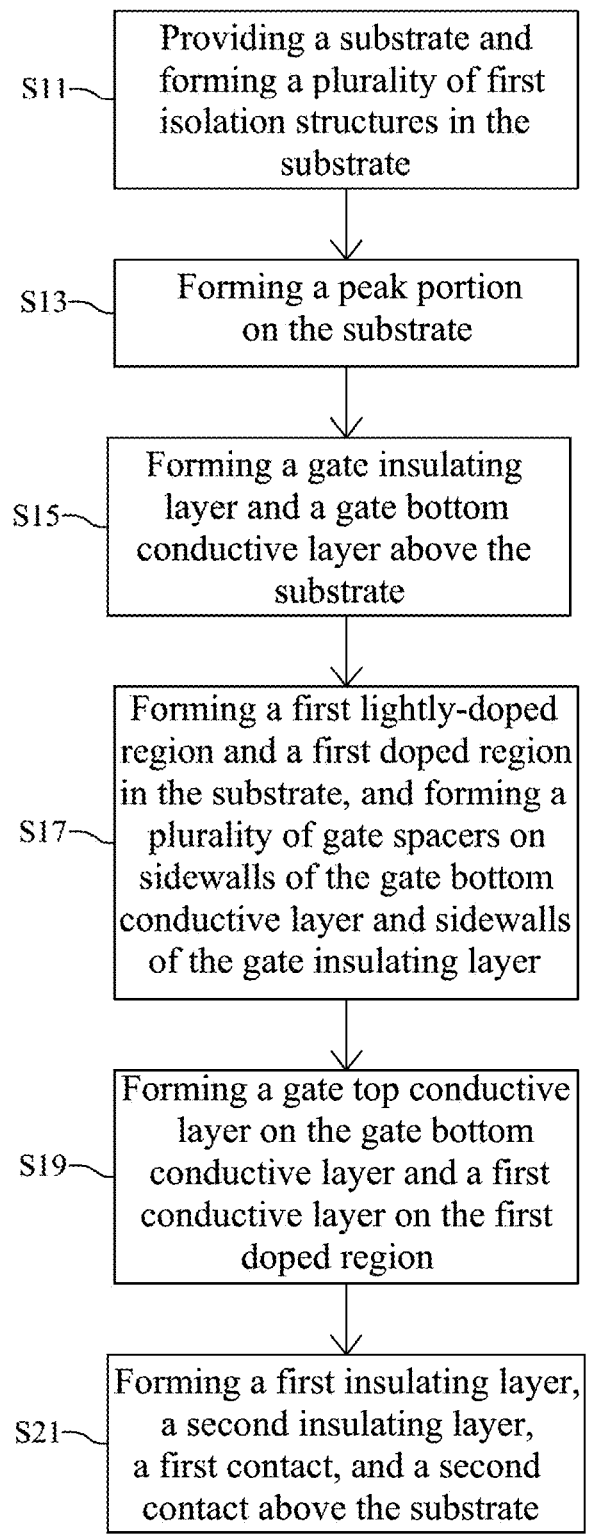
FIG. 8 illustrates, in a flowchart diagram form, a method for fabricating a semiconductor device in accordance with one embodiment of the present disclosure.

FIG. 8 illustrates, in a flowchart diagram form, a method 100 for fabricating a semiconductor device 10A in accordance with one embodiment of the present disclosure. FIGS. 9 to 20 illustrate, in schematic cross-sectional view diagrams, a flow for fabricating the semiconductor device 10A in accordance with one embodiment of the present disclosure.

Figure 9:
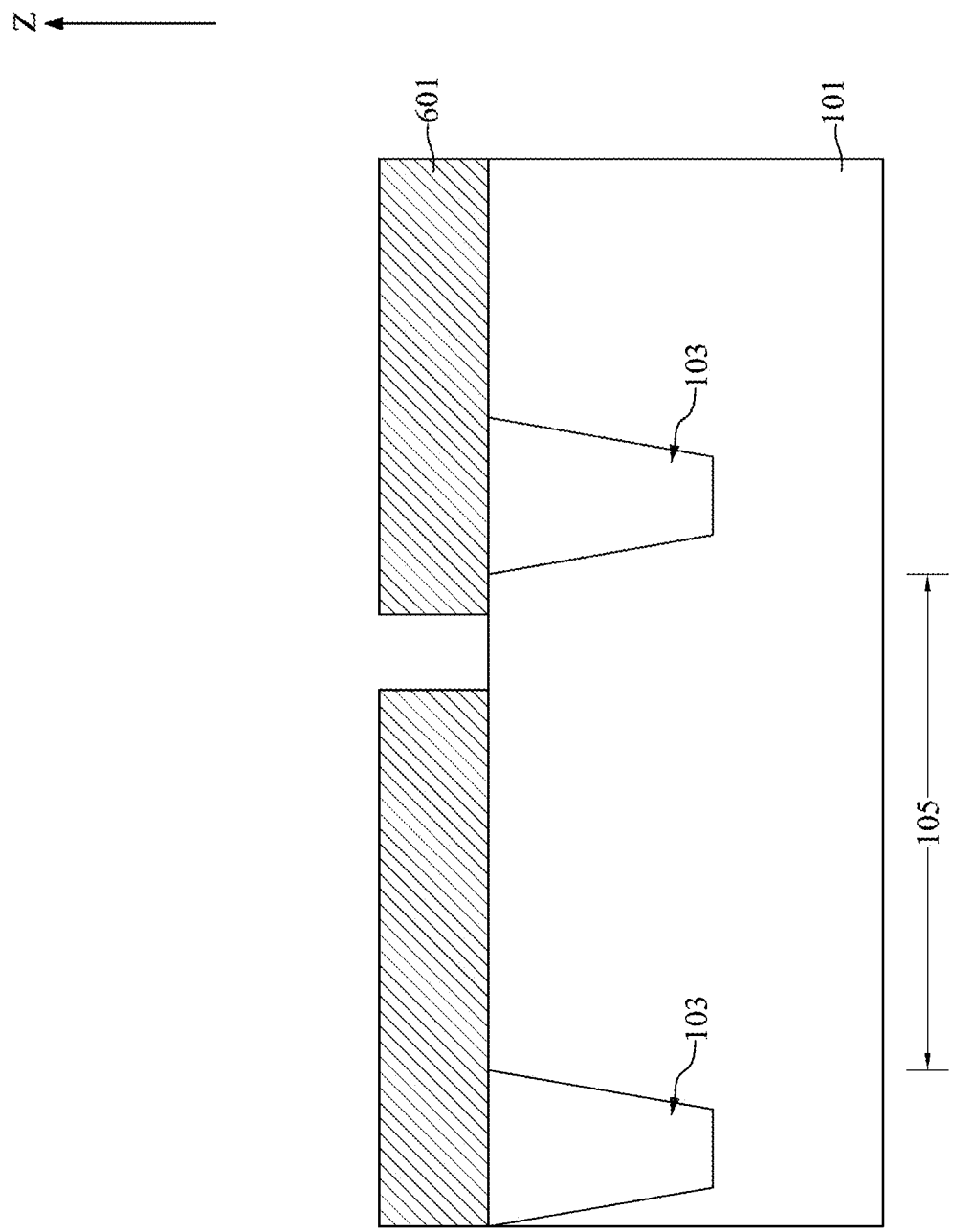
FIGS. 9 to 20 illustrate, in schematic cross-sectional view diagrams, a flow for fabricating the semiconductor device in accordance with one embodiment of the present disclosure.

With reference to FIGS. 8 and 9, at step S11, in the embodiment depicted, a substrate 101 may be provided and a plurality of first isolation structures 103 may be formed in the substrate 101. A series of deposition processes may be performed to deposit a pad oxide layer (not shown in FIG. 9) and a pad nitride layer (not shown in FIG. 9) on the substrate 101. A photolithography process may be performed to define positions of the plurality of first isolation structures 103. After the photolithography process, an etch process, such as an anisotropic dry etch process, may be performed to form trenches penetrating through the pad oxide layer, the pad nitride layer, and the substrate 101. An insulating material may be deposited into the trenches and a planarization process, such as chemical mechanical polishing, may be subsequently performed to remove excess filling material until the substrate 101 is exposed. The insulating material may be, for example, silicon oxide, silicon nitride, silicon oxynitride, silicon nitride oxide, or fluoride-doped silicate.

Figure 10:
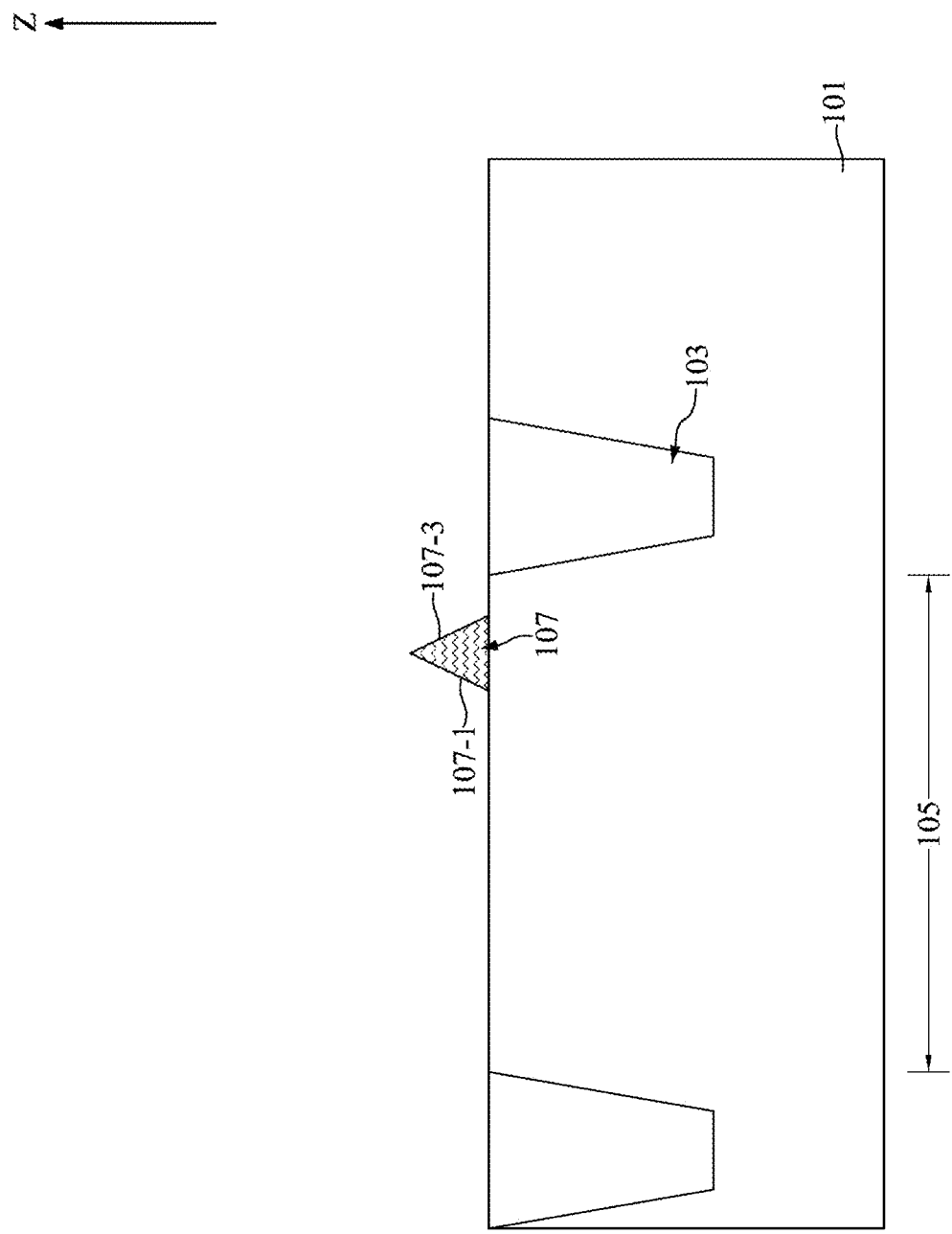

With reference to FIGS. 8, 9 and 10, at step S13, in the embodiment depicted, a peak portion 107 may be formed on the substrate 101. With reference to FIG. 9, a photolithography process using a first mask layer 601 as a mask may be performed to define a position of the peak portion 107. After patterning the first mask layer 601, a portion of the top surface of the substrate 101 may be exposed. With reference to FIG. 10, the peak portion 107 is an epitaxy silicon, which may be formed on the portion of the top surface of the substrate 101 by an epitaxial growth process. After the epitaxial growth process, the first mask layer 601 may be removed.

Figure 11:
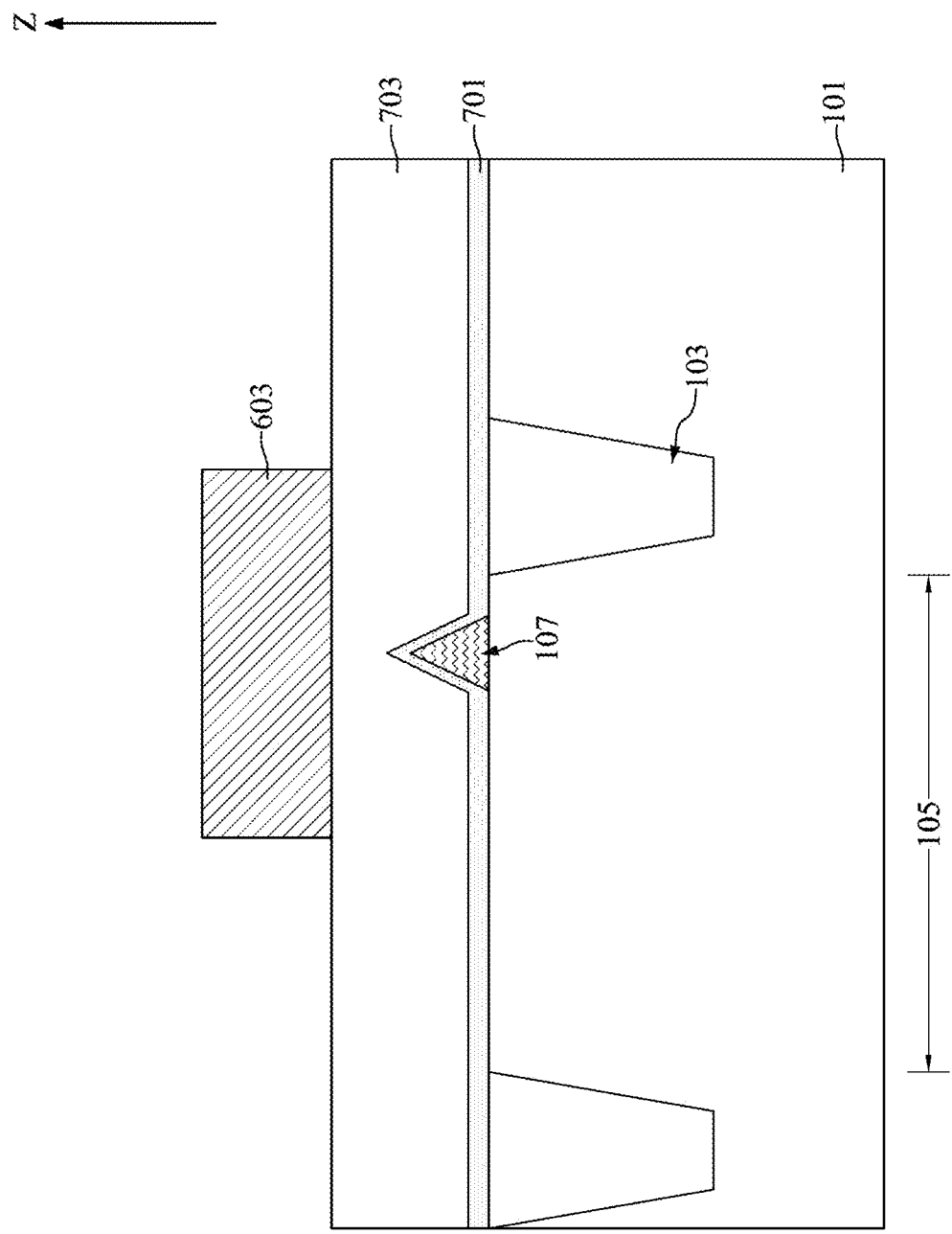
Figure 12:
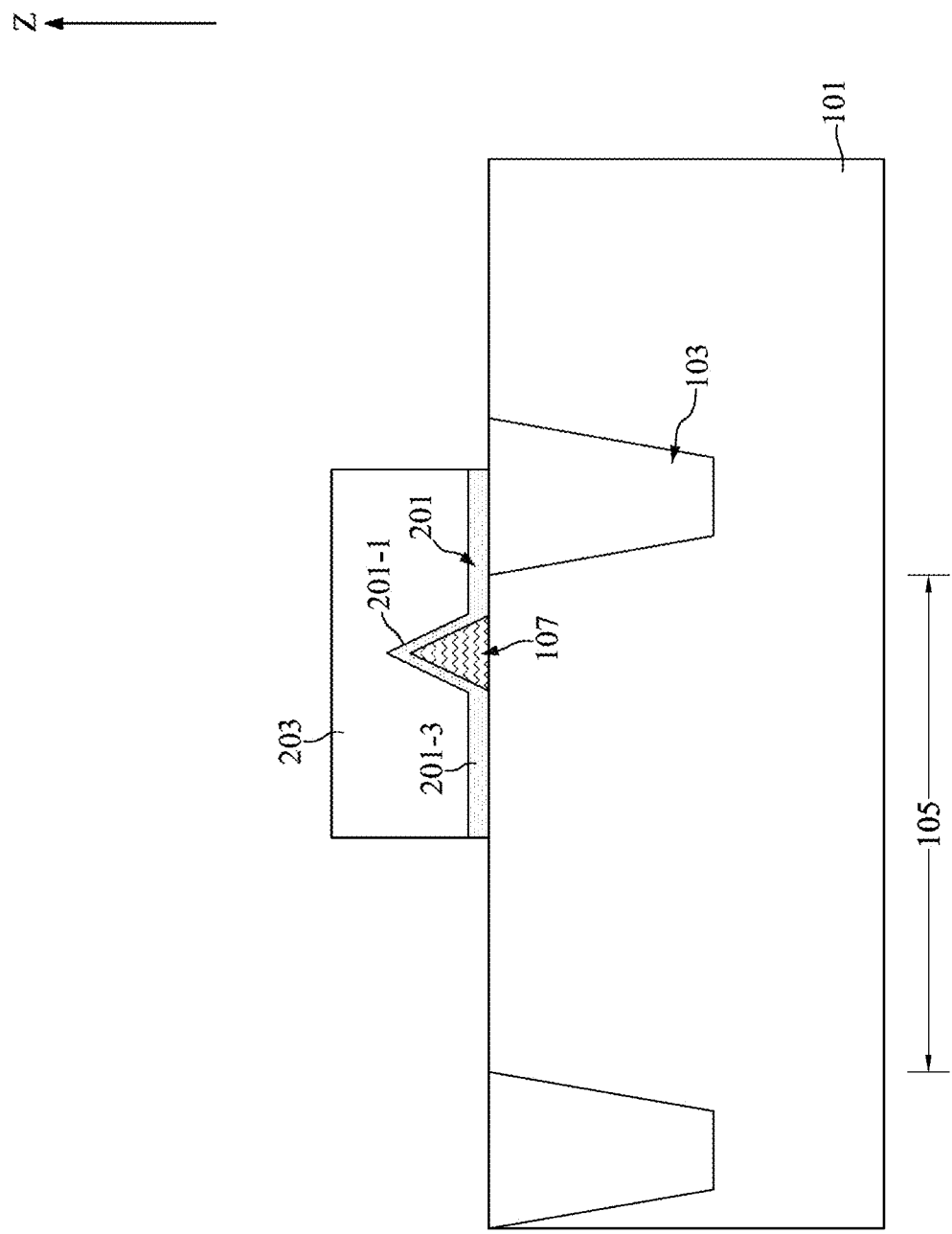

With reference to FIGS. 8, 11 and 12, at step S15, in the embodiment depicted, a gate insulating layer 201 and a gate bottom conductive layer 203 may be formed above the substrate 101. With reference to FIG. 11, a layer of first insulating material 701 may be formed to cover the peak portion 107 and the top surface of the substrate 101. A layer of first conductive material 703 may be formed on the layer of the first insulating material 701. A photolithography process using a second mask layer 603 as a mask may be performed to define positions of the gate insulating layer 201 and the gate bottom conductive layer 203. The first insulating material 701 may be, for example, silicon oxide. The first conductive material 703 may be, for example, a conductive material such as polycrystalline silicon, polycrystalline silicon germanium, or a combination thereof. After the photolithography process, an etch process, such as an anisotropic dry etch process, may be performed to remove portions of the first insulating material 701 and portions of the first conductive material 703, and concurrently form the gate insulating layer 201 and the gate bottom conductive layer 203. After the etch process, the second mask layer 603 may be removed.

Figure 13:
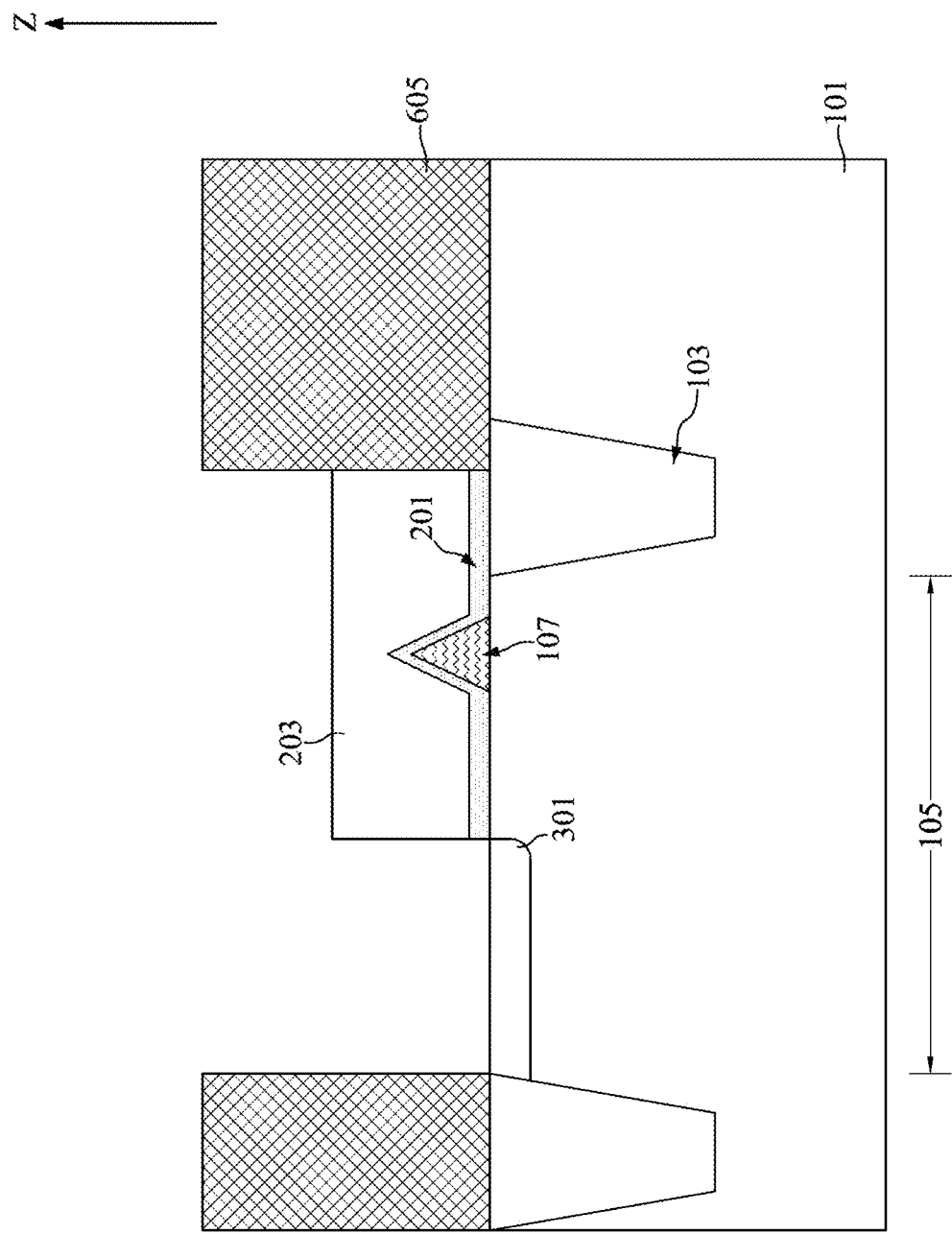

With reference to FIG. 8 and FIGS. 13 to 16, at step S17, in the embodiment depicted, a first lightly-doped region 301 and a first doped region 303 may be formed in the substrate 101, and a plurality of gate spacers may be formed on sidewalls of the gate bottom conductive layer 203 and sidewalls of the gate insulating layer 201. With reference to FIG. 13, a photolithography process using a third mask layer 605 may be performed to mask portions of the top surface of the substrate 101. Only a portion of the first active area 105 and a top surface of the gate bottom conductive layer 203 may be exposed. After the photolithography process, an implantation process may be performed to form the first lightly-doped region 301 in the first active area 105. After the implantation process, the third mask layer 605 may be removed.

Figure 14:
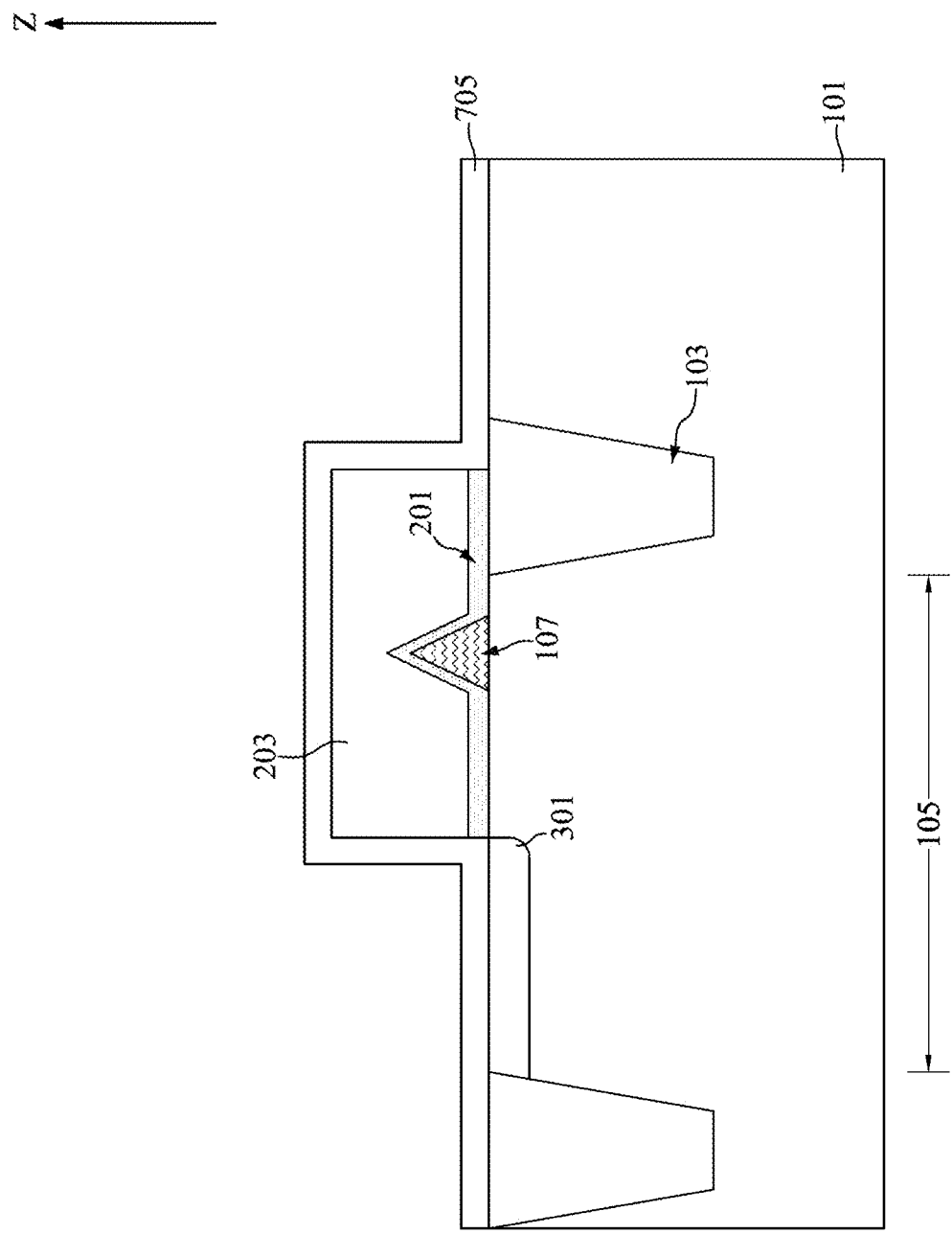
Figure 15:
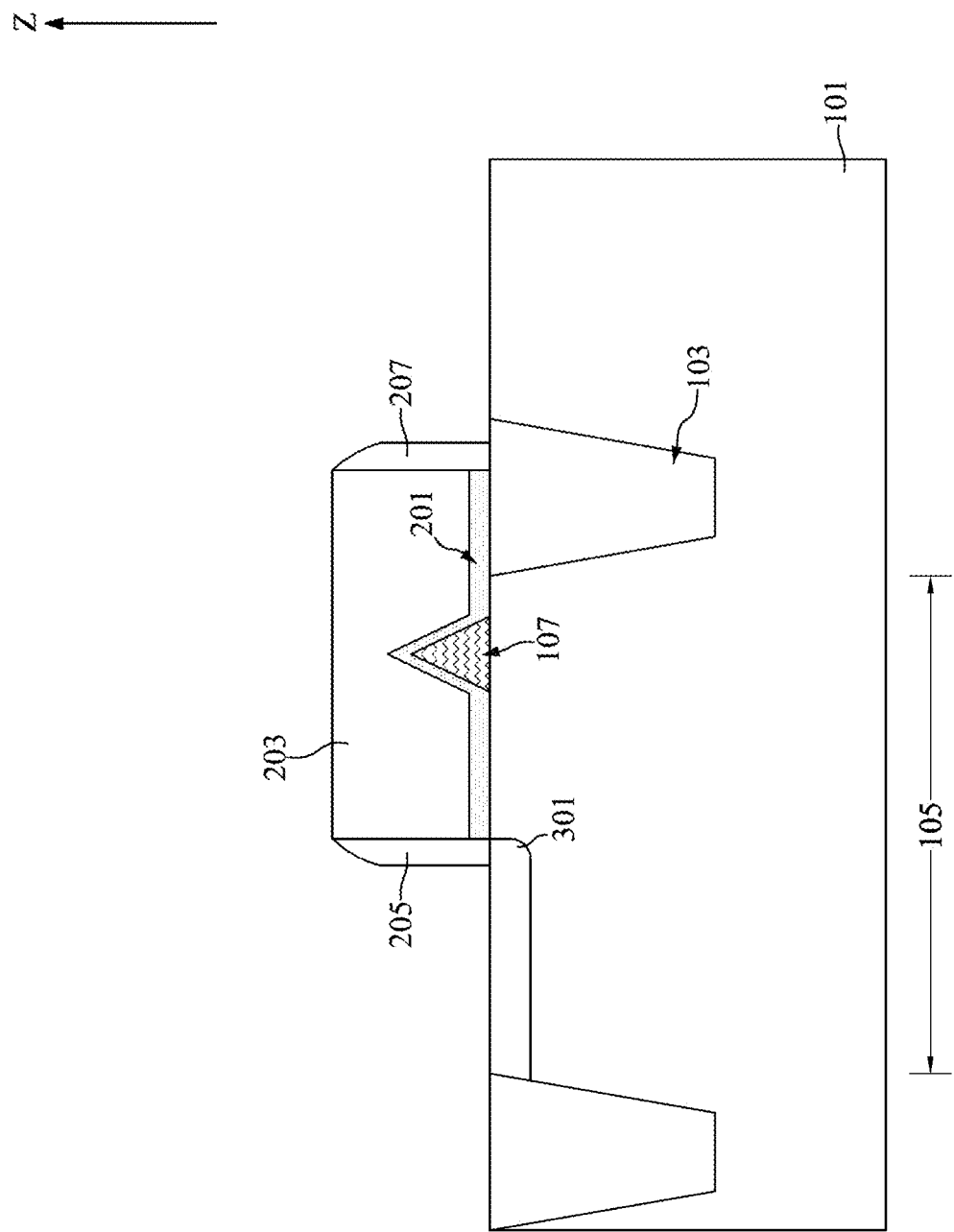

With reference to FIG. 14, a layer of spacer material 705 may be formed to cover the top surface of the substrate 101, the sidewalls of the gate insulating layer 201, the sidewalls of the gate bottom conductive layer 203, and the top surface of the gate bottom conductive layer 203. With reference to FIG. 15, an etch process, such as an anisotropic dry etch process, may be performed to remove portions of the spacer material 705 and concurrently form the plurality of gate spacers. The plurality of gate spacers may include a first gate spacer 205 and a second gate spacer 207 respectively correspondingly formed on the sidewalls of the gate bottom conductive layer 203 and the sidewalls of the gate insulating layer 201. The spacer material 705 may be, for example, silicon oxide, silicon nitride, or the like.

Figure 16:
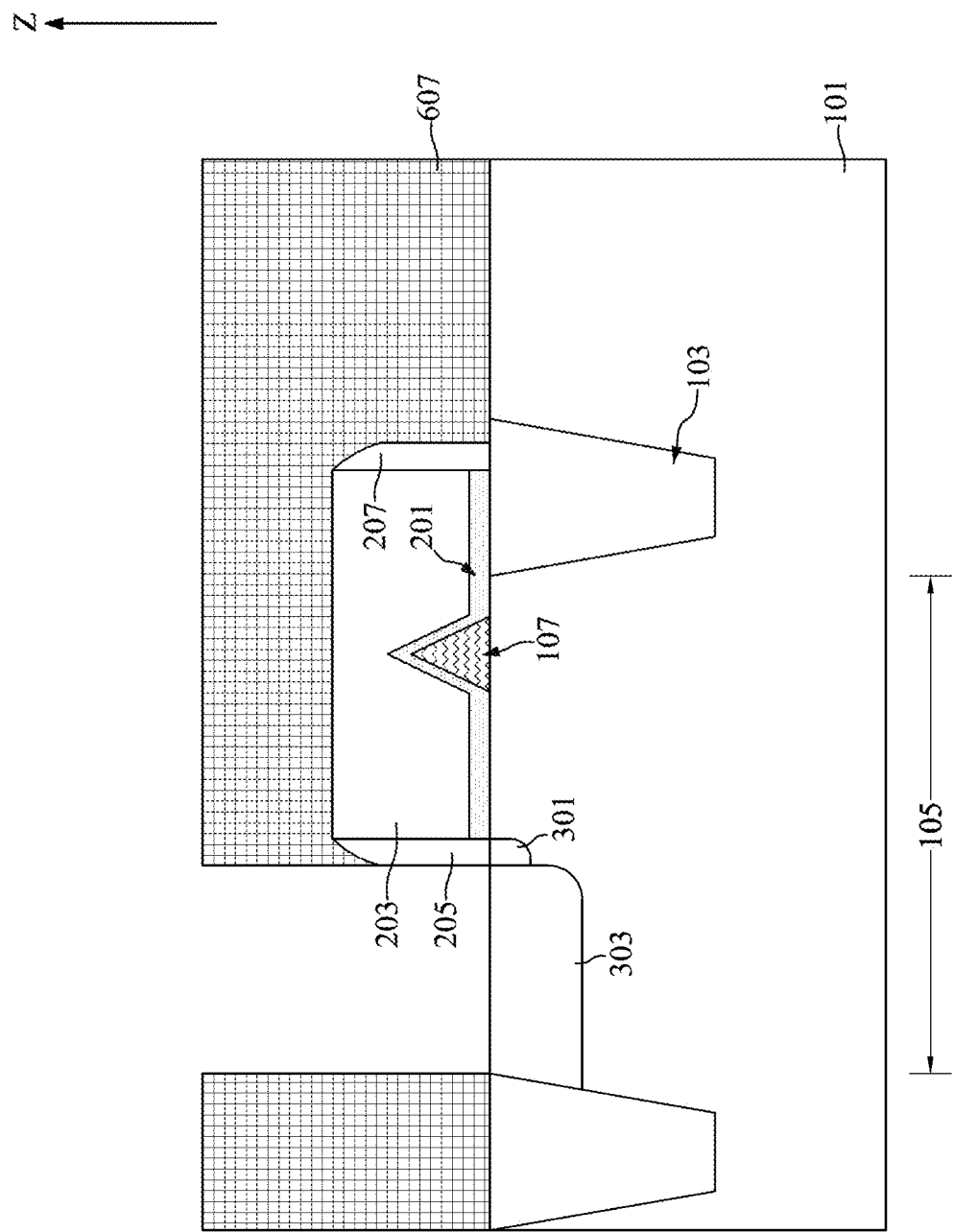

With reference to FIG. 16, a photolithography process using a fourth mask layer 607 may be performed to mask the plurality of gate spacers, the top surface of the gate bottom conductive layer 203, and portions of the top surface of the substrate 101. Only a portion of the first active area 105 may be exposed. After the photolithography process, an implantation process may be performed to form the first doped region 303 in the first active area 105. After the implantation process, the fourth mask layer 607 may be removed. An annealing process may be performed to activate the first lightly-doped region 301 and the first doped region 303. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 17:
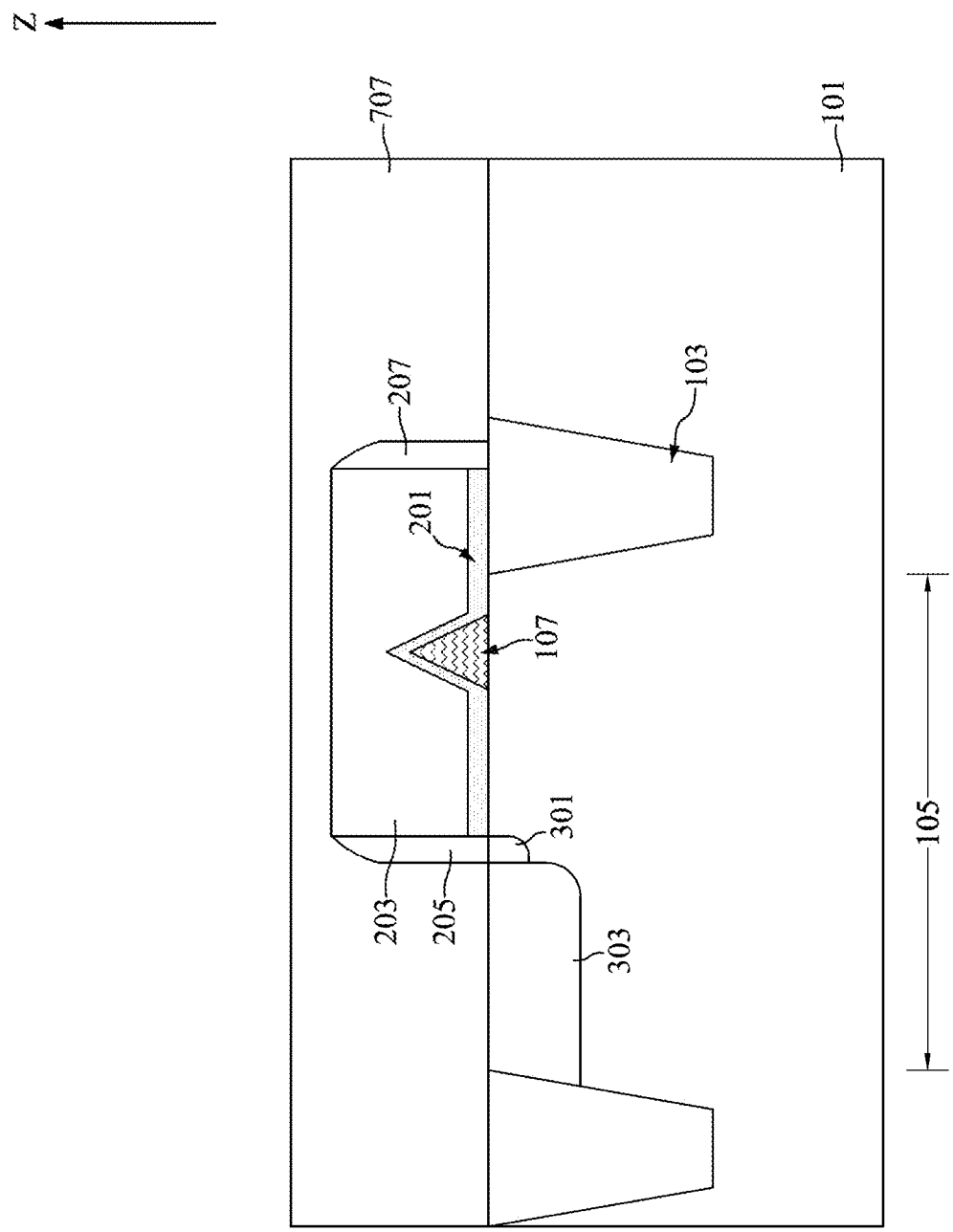
Figure 18:
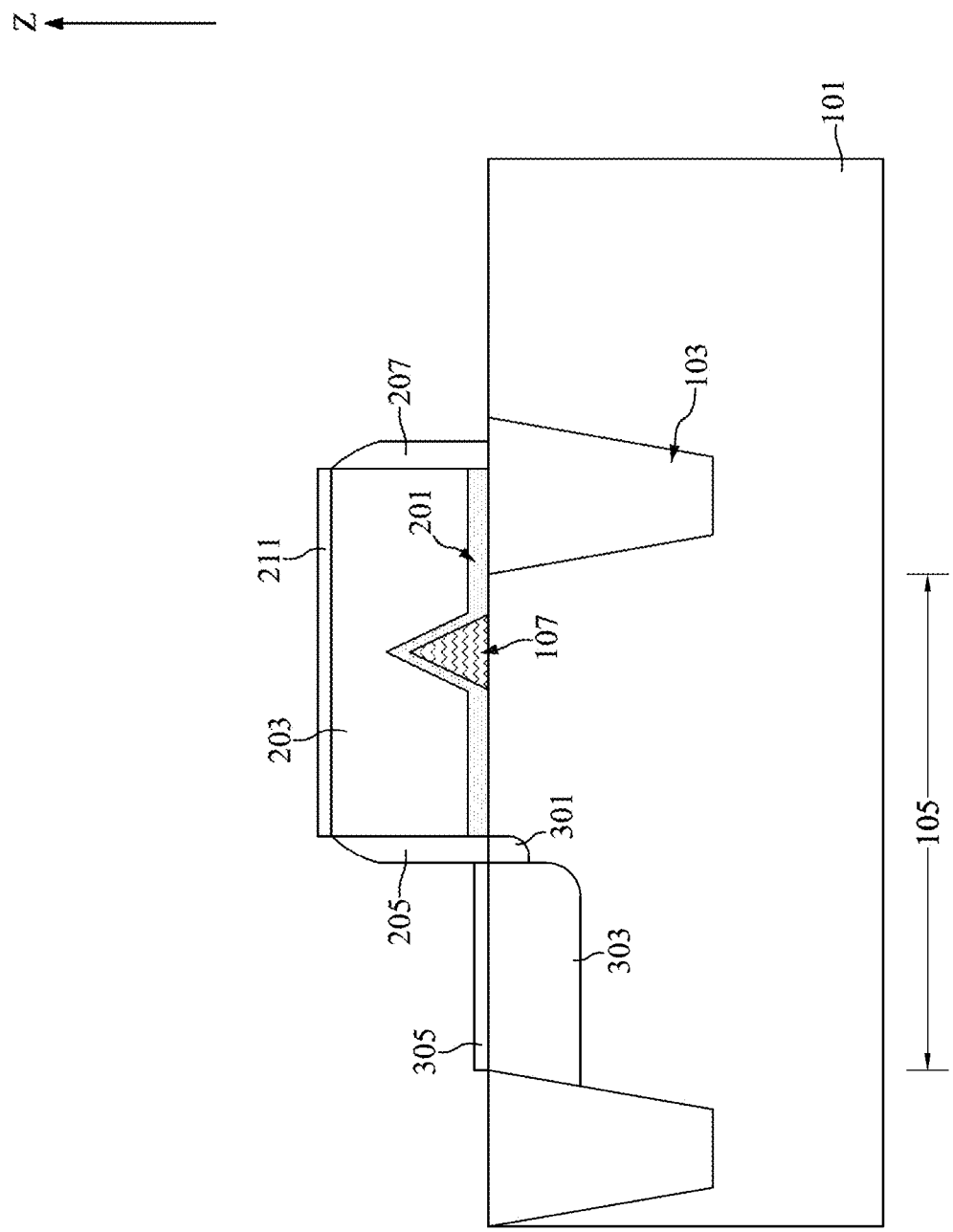

With reference to FIGS. 8, 17 and 18, at step S19, in the embodiment depicted, a gate top conductive layer 211 may be formed on the gate bottom conductive layer 203 and a first conductive layer 305 may be formed on the first doped region 303. With reference to FIG. 17, a layer of second conductive material 707 may be formed over the substrate 101, the plurality of gate spacers, and the gate bottom conductive layer 203. The second conductive material 707 may include, for example, titanium, nickel, platinum, tantalum, or cobalt. With reference to FIG. 18, a thermal treatment may be performed. During the thermal treatment, metal atoms of the metal layer may react chemically with silicon atoms of the gate bottom conductive layer 203 and the first doped region 303 to form the gate top conductive layer 211 and the first conductive layer 305, respectively. The gate top conductive layer 211 and the first conductive layer 305 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted second conductive material 707. The cleaning process may use etchant such as hydrogen peroxide or an SC-1 solution.

Figure 19:
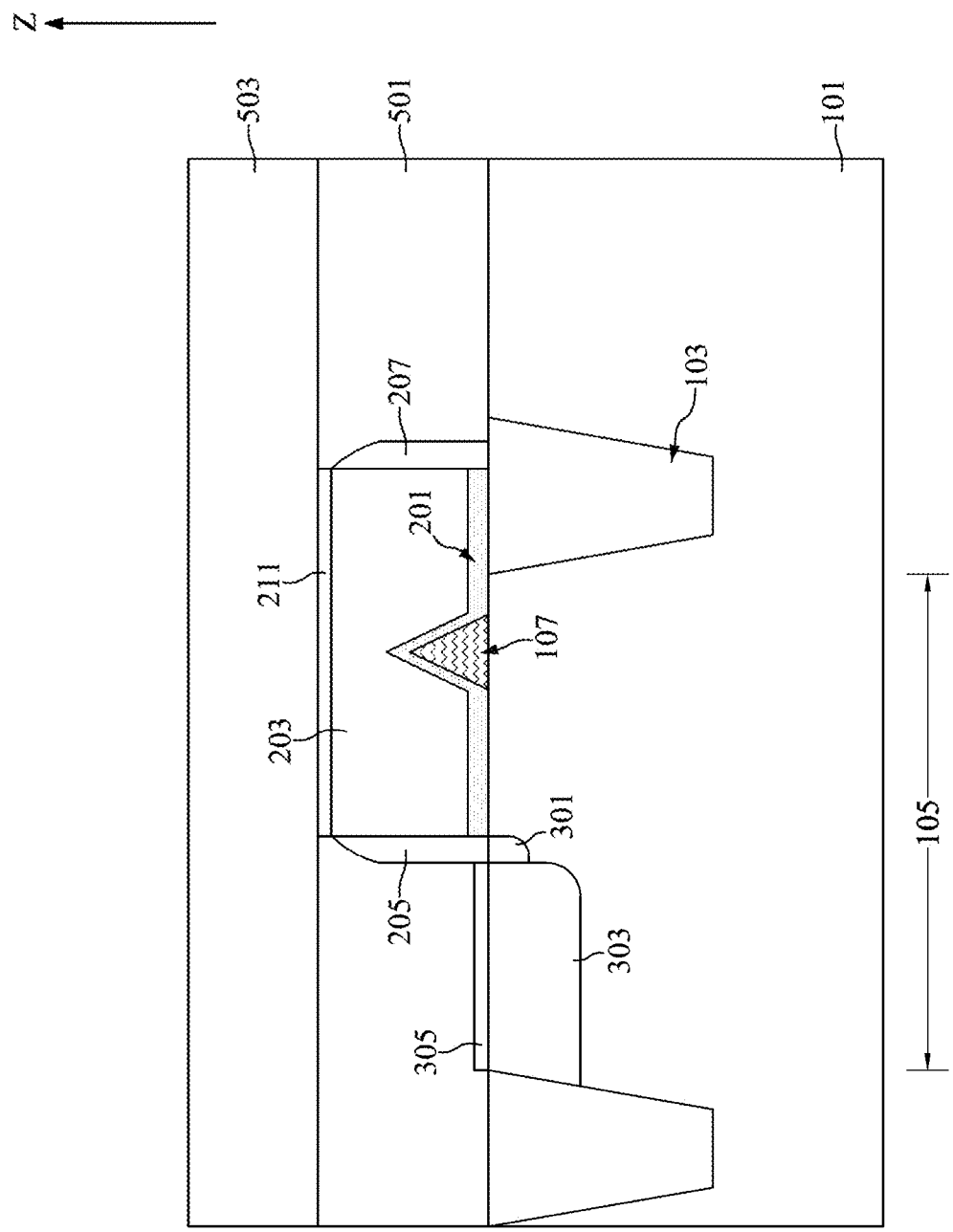
Figure 20:
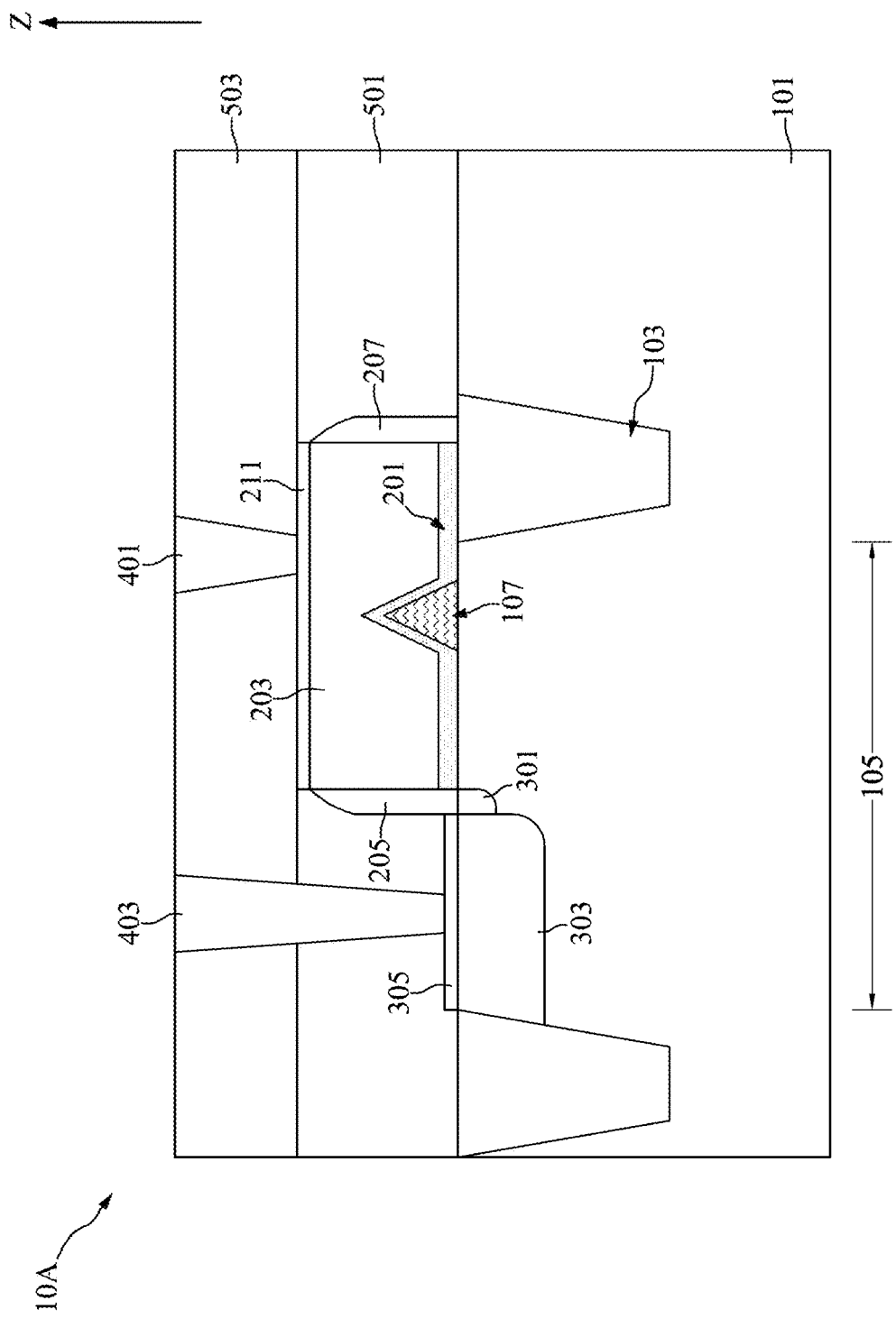

With reference to FIGS. 8, 19 and 20, at step S21, in the embodiment depicted, a first insulating layer 501, a second insulating layer 503, a first contact 401, and a second contact 403 may be formed above the substrate 101. With reference to FIG. 19, a layer of insulating material may be deposited over the substrate 101, the first conductive layer 305, the plurality of gate spacers, and the gate top conductive layer 211. A planarization process, such as chemical mechanical polishing, may be performed until the top surface of the gate top conductive layer 211 is exposed and the first insulating layer 501 is formed. Subsequently, the second insulating layer 503 may be deposited over the first insulating layer 501 by, for example, chemical vapor deposition.

With reference to FIG. 20, a first photolithography process may be performed to define a position of the first contact 401. After the first photolithography process, a first etch process, such as an anisotropic dry etch process, may be performed to form a first contact opening in the second insulating layer 503. A conductive material may be deposited into the first contact opening by a metallization process. After the metallization process, a planarization process, such as chemical mechanical polishing, may be performed to remove excess filling material, provide a substantially flat surface for subsequent processing steps, and conformally form the first contact 401.

With reference to FIG. 20, a second photolithography process may be performed to define a position of the second contact 403. After the second photolithography process, a second etch process, such as an anisotropic dry etch process, may be performed to form a second contact opening extending through the second insulating layer 503 and the first insulating layer 501. A conductive material may be deposited into the first contact opening by a metallization process. After the metallization process, a planarization process, such as chemical mechanical polishing, may be performed to remove excess filling material, provide a substantially flat surface for subsequent processing steps, and conformally form the second contact 403.

FIGS. 21 to 24 illustrate, in schematic cross-sectional view diagrams, part of another flow for fabricating a peak portion 107 of a semiconductor device in accordance with one embodiment of the present disclosure.

Figure 21:
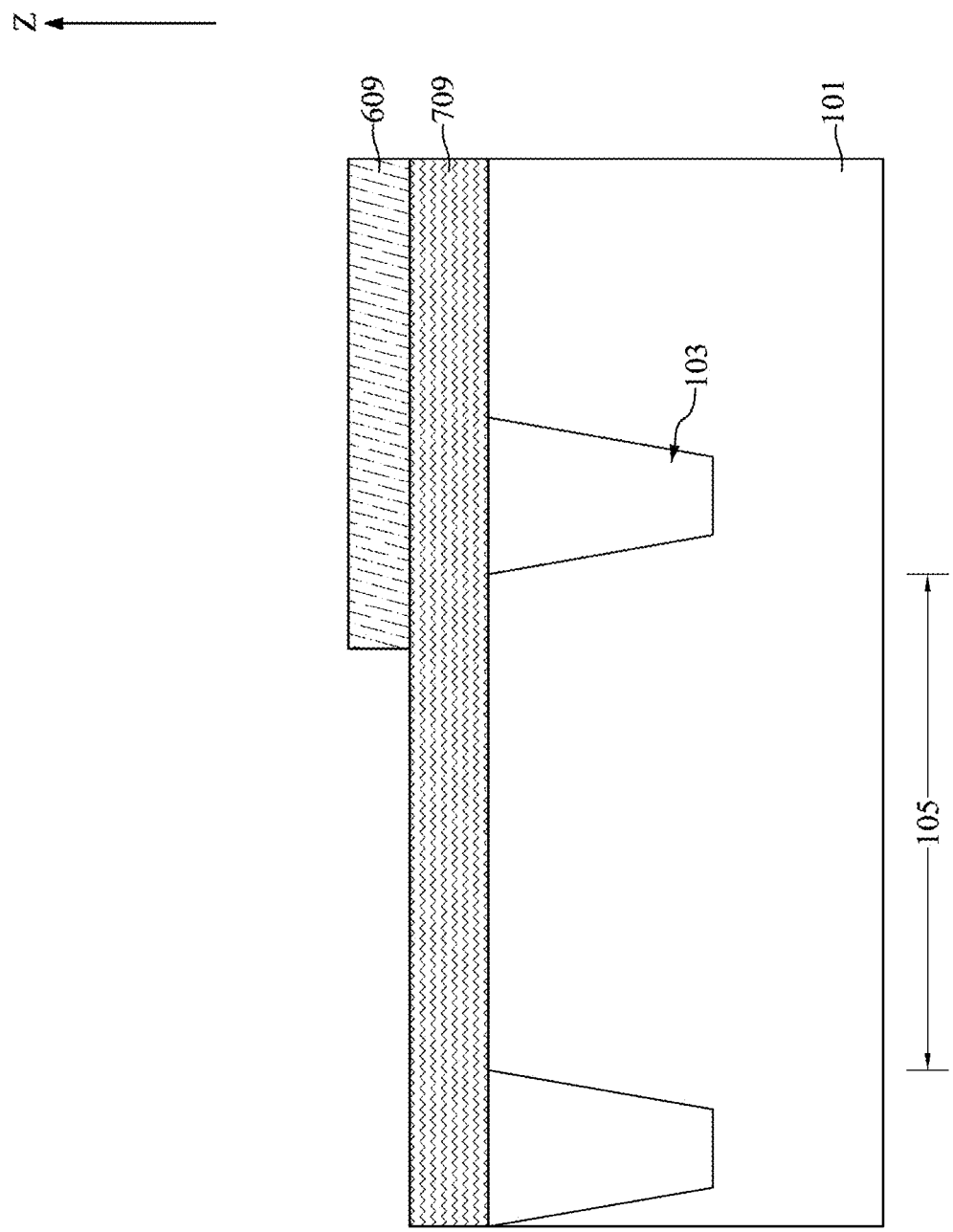
FIGS. 21 to 24 illustrate, in schematic cross-sectional view diagrams, part of another flow for fabricating a peak portion of a semiconductor device in accordance with one embodiment of the present disclosure.

With reference to FIG. 21, an intermediate semiconductor device may be fabricated by a procedure similar to that illustrated in FIG. 9. A layer of semiconductor material 709 may be deposited over the top surface of the substrate 101 by, for example, chemical vapor deposition, atomic layer deposition, or epitaxial growth. The semiconductor material 709 may be, for example, silicon, germanium, silicon germanium, silicon carbon, silicon germanium carbon, gallium, gallium arsenic, indium arsenic, indium phosphorus, or the like. A fifth mask layer 609 may be formed over the layer of the semiconductor material 709 and mask a right portion of the top surface of the layer of the semiconductor material 709. A left portion of the top surface of the layer of the semiconductor material 709 may be left exposed.

Figure 22:
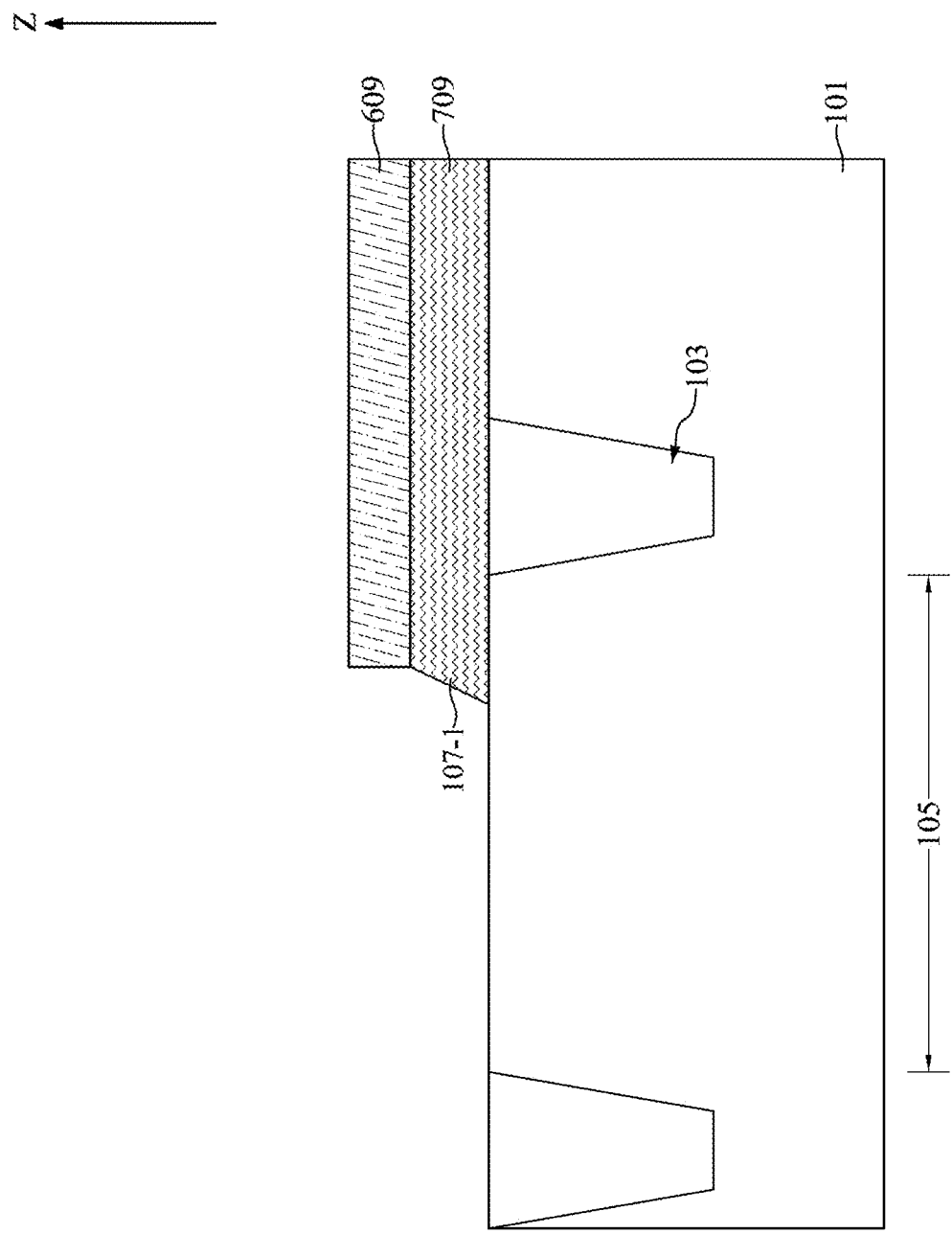
Figure 23:
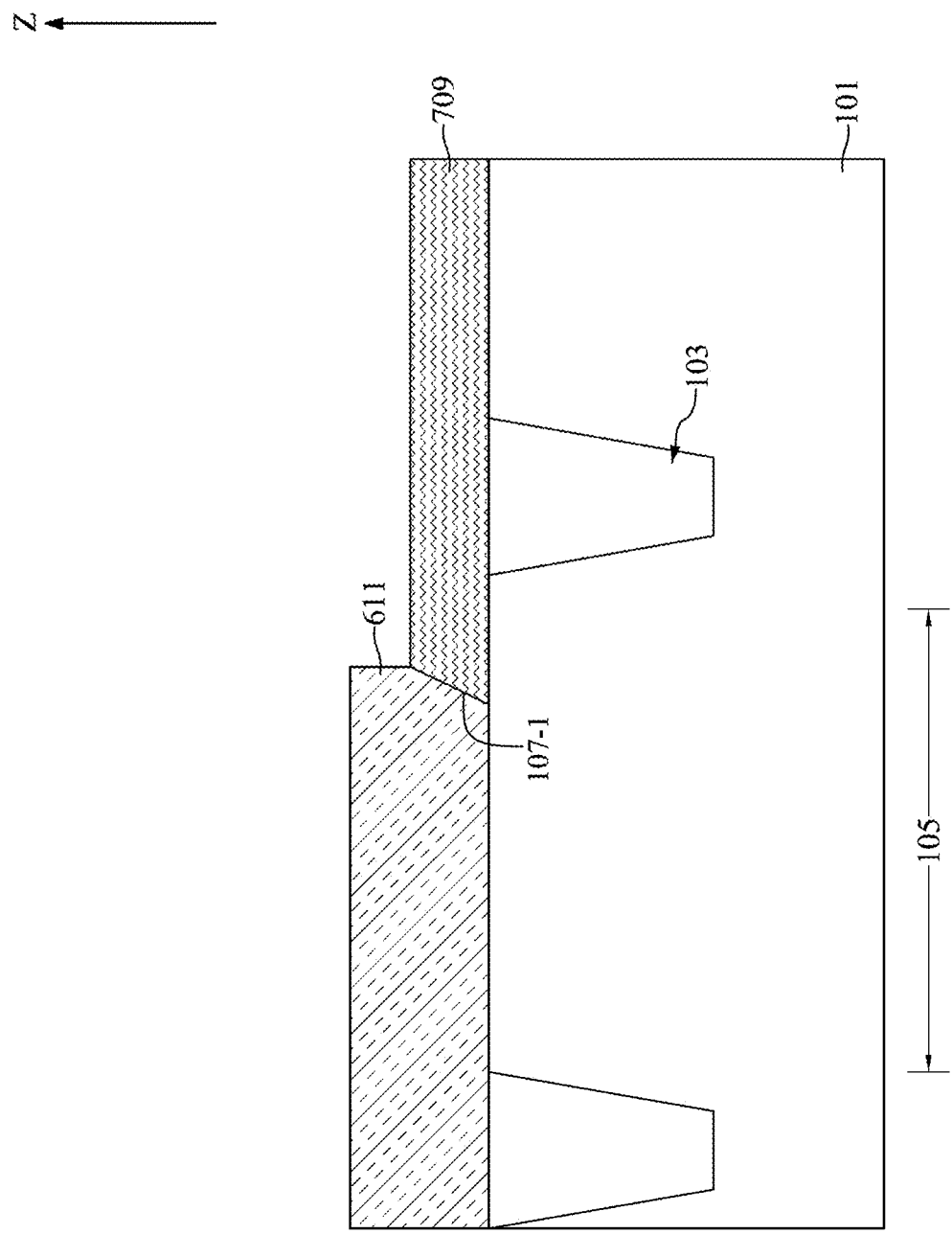

With reference to FIG. 22, a first wet etch process may be performed to remove portions of the layer of the semiconductor material 709 and form a first faceted plane 107-1 with a crystal orientation <111>. After the first wet etch process, the fifth mask layer 609 may be removed. With reference to FIG. 23, a sixth mask layer 611 may be formed over the substrate 101 and the first faceted plane 107-1. The right portion of the top surface of the layer of the semiconductor material 709 may be exposed.

Figure 24:
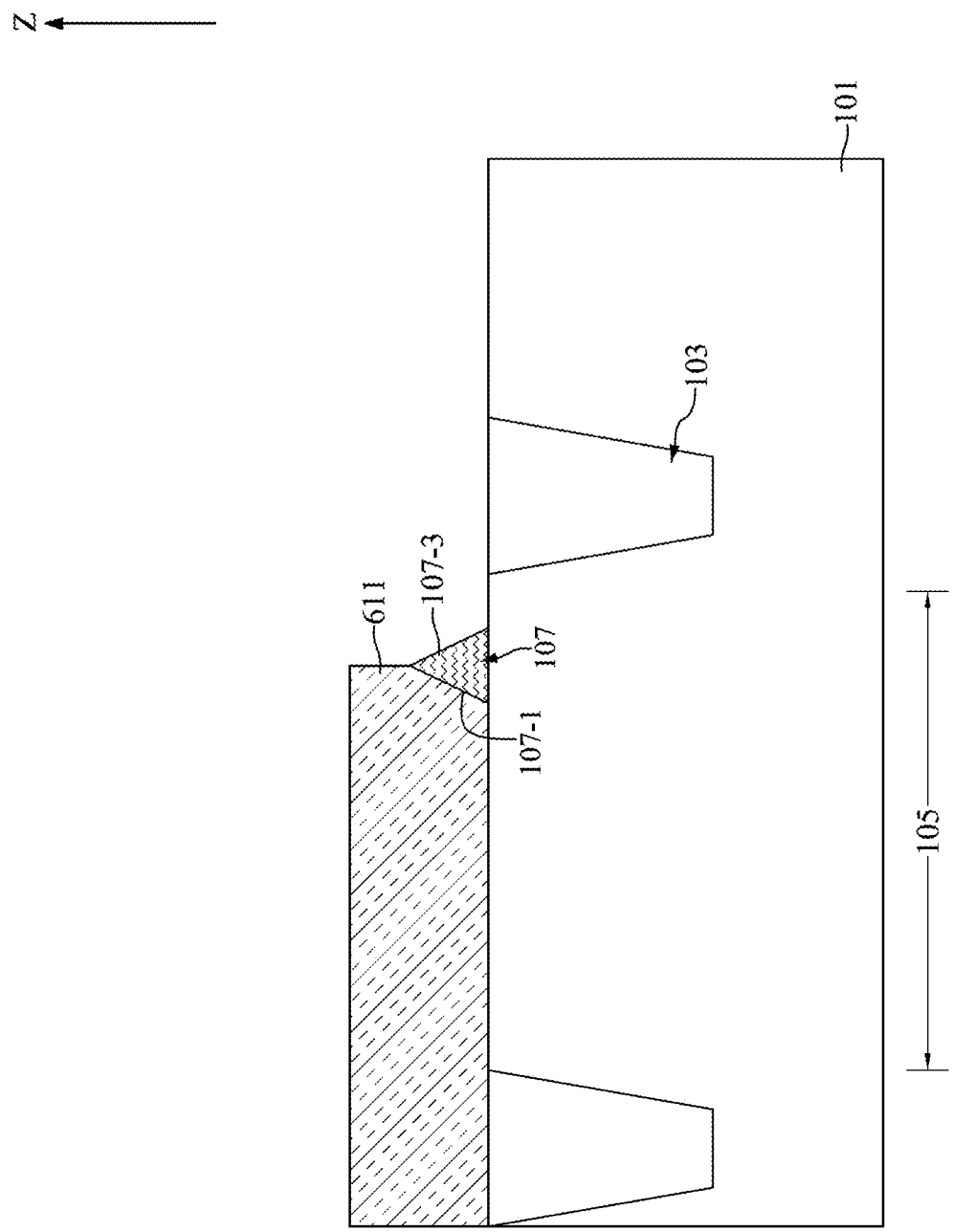

With reference to FIG. 24, a second wet etch process may be performed to remove portions of the layer of the semiconductor material 709 and form a second faceted plane 107-3 with a crystal orientation <111>. Concurrently, the peak portion 107 may be formed after the second wet etch process. The first wet etch process and the second wet etch process may conducted with a mixture including potassium hydroxide, isopropyl alcohol, and water at a temperature between about 80° C. and about 82° C. After the second wet etch process, the sixth mask layer 611 may be removed.

Figure 25:
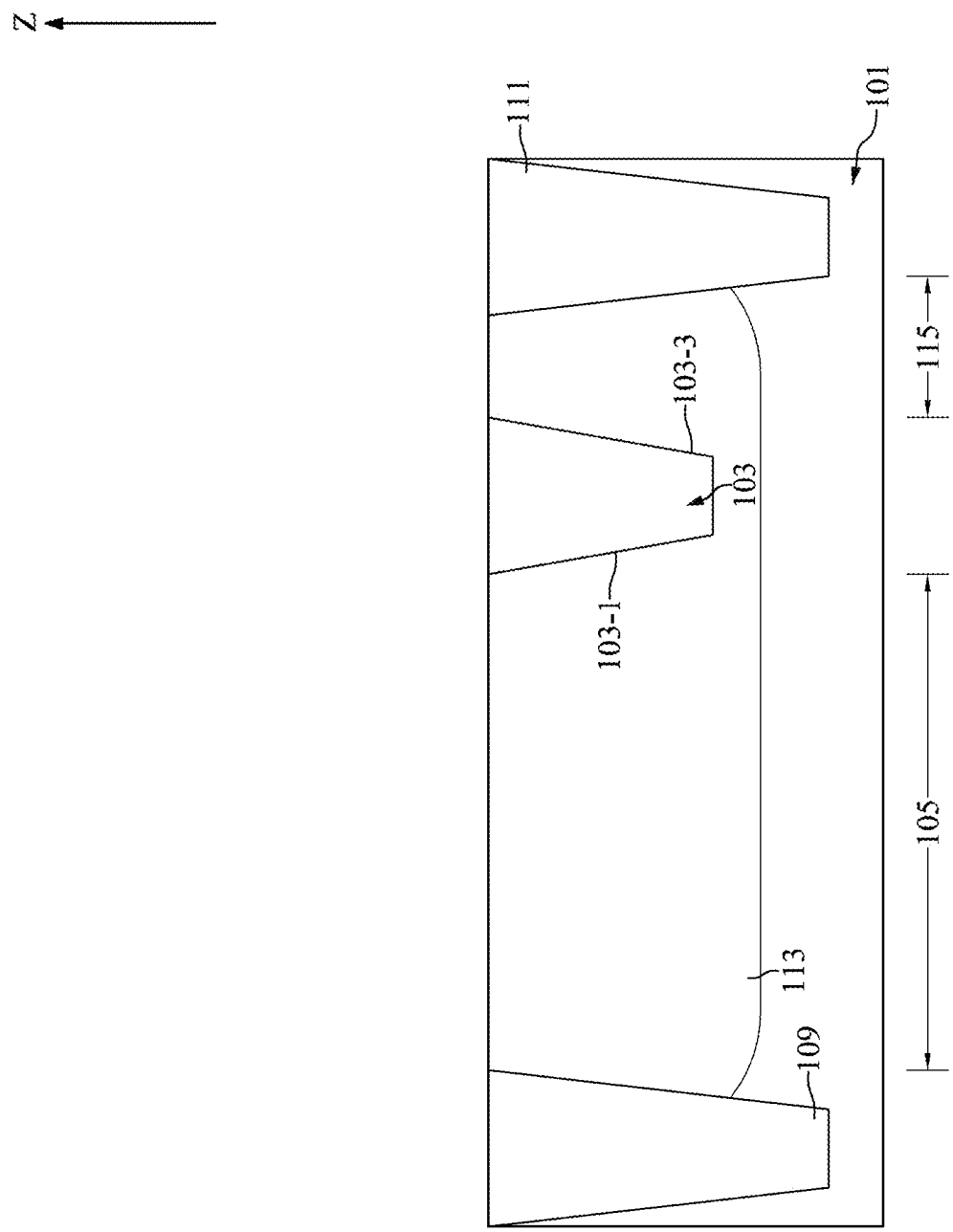
FIGS. 25 to 27 illustrate, in schematic cross-sectional view diagrams, another flow for fabricating a semiconductor device in accordance with one embodiment of the present disclosure.
Figure 26:
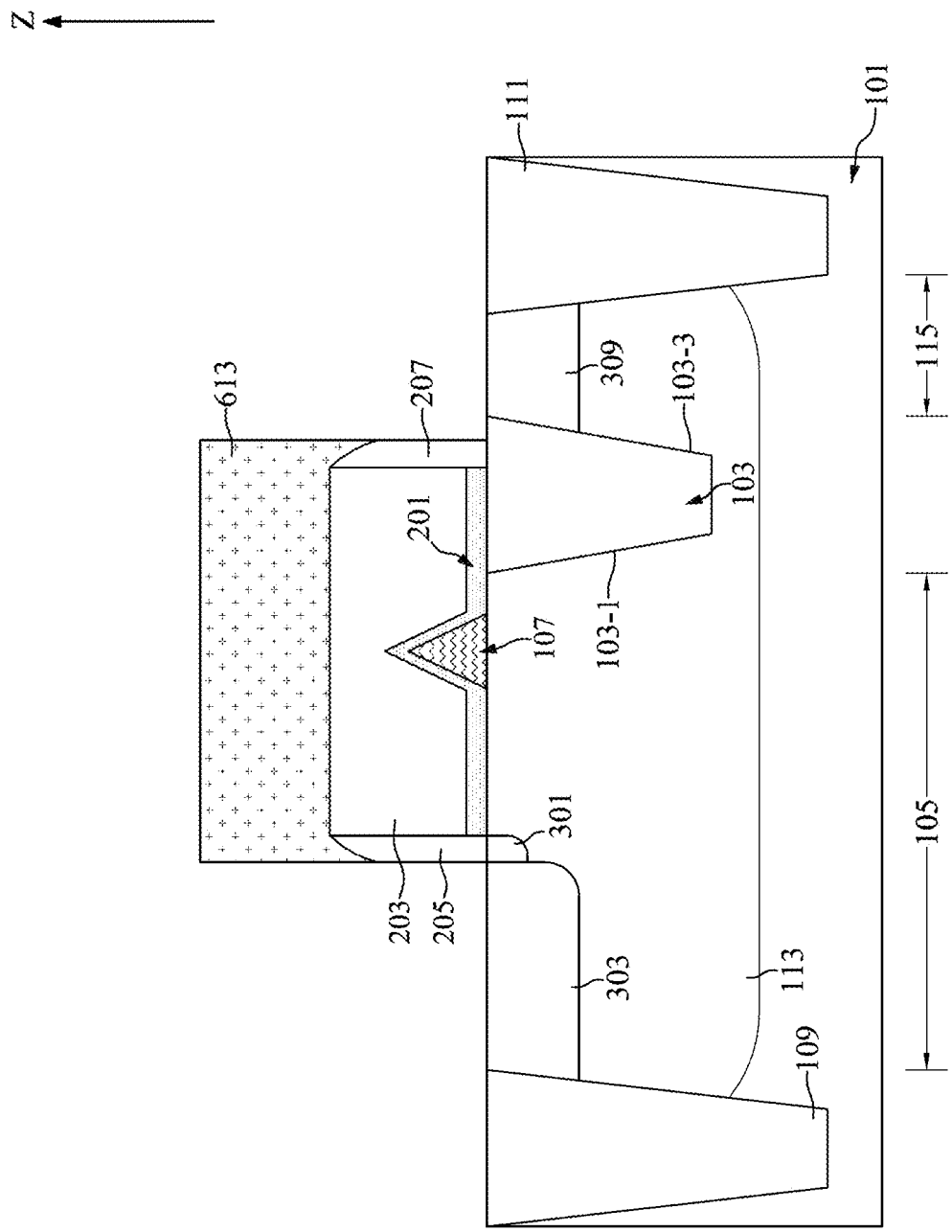
Figure 27:
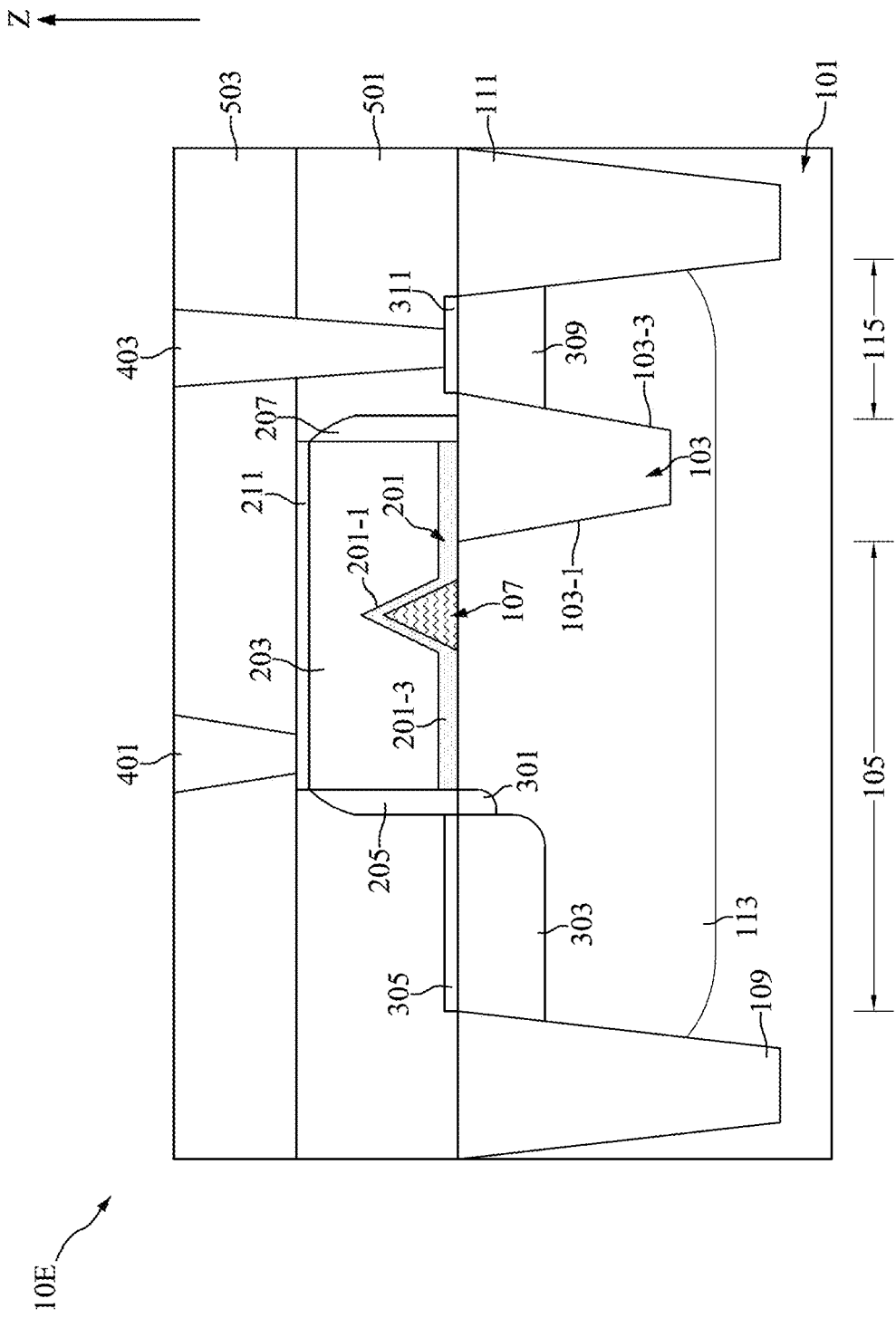

FIGS. 25 to 27 illustrate, in schematic cross-sectional view diagrams, another flow for fabricating a semiconductor device 10E in accordance with one embodiment of the present disclosure.

With reference to FIG. 25, the second isolation structure 109 and the third isolation structure 111 may be formed in the substrate 101 using a procedure similar to that illustrated in FIG. 9. An implantation process may be performed to form the first well region 113 in the substrate 101 and between the second isolation structure 109 and the third isolation structure 111. Subsequently, the first isolation structure 103 may be formed in the first well region 113 using a procedure similar to that illustrated in FIG. 9.

With reference to FIG. 26, the peak portion 107, the gate insulating layer 201, the gate bottom conductive layer 203, the first gate spacer 205, the second gate spacer 207, and the first lightly-doped region 301 may be formed using a procedure similar to that illustrated in FIGS. 10 to 15. A seventh mask layer 613 may be formed over the gate bottom conductive layer 203, the first gate spacer 205, and the second gate spacer 207. An implantation process may be performed to concurrently form the first doped region 303 and the second doped region 309 in the first well region 113. After the implantation process, the seventh mask layer 613 may be removed.

With reference to FIG. 27, the gate top conductive layer 211, the first conductive layer 305, the second conductive layer 311, the first contact 401, the second contact 403, the first insulating layer 501, and the second insulating layer 503 may be formed using a procedure similar to that illustrated in FIGS. 17 to 20.

Due to the design of the semiconductor device of the present disclosure, the rupture point of the gate insulating layer 201 may be easily limited in the place adjacent to the vertex of the peak portion 107. As result, the reliability of programming the semiconductor device 10A may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a peak portion positioned on the substrate;
a gate insulating layer positioned on the peak portion and the substrate;
a gate bottom conductive layer positioned on the gate insulating layer;
a first doped region positioned in the substrate and adjacent to one end of the gate insulating layer; and
a plurality of first isolation structures positioned in the substrate, wherein the plurality of first isolation structures define a first active area in the substrate, and the first doped region is positioned in the first active area, wherein another end of the gate insulating layer is disposed on one of the plurality of first isolation structures.

2. The semiconductor device of claim 1, wherein the gate insulating layer comprises a capping portion positioned on the peak portion and two flat portions positioned adjacent to two sides of the capping portion and on the substrate, wherein a thickness of the two flat portions is greater than or equal to a thickness of the capping portion.

3. The semiconductor device of claim 1, further comprising a plurality of gate spacers positioned on sidewalls of the gate bottom conductive layer and sidewalls of the gate insulating layer.

4. The semiconductor device of claim 1, further comprising a first lightly-doped region positioned in the first active area and adjacent to the one end of the gate insulating layer.

5. The semiconductor device of claim 1, further comprising a gate top conductive layer positioned on the gate bottom conductive layer and a first conductive layer positioned on the first doped region, wherein a thickness of the gate top conductive layer is between about 2 nm and about 20 nm and a thickness of the first conductive layer is between about 2 nm and about 20 nm.

6. The semiconductor device of claim 5, further comprising a first contact positioned on the gate top conductive layer and a second contact positioned on the first conductive layer.

7. The semiconductor device of claim 6, further comprising a first insulating layer positioned on the substrate and a second insulating layer positioned on the first insulating layer, wherein the first contact is positioned in the second insulating layer and the second contact penetrates the second insulating layer and the first insulating layer.

8. The semiconductor device of claim 7, further comprising a first barrier layer positioned between the first contact and the second insulating layer and between the first contact and the gate top conductive layer.

9. The semiconductor device of claim 7, further comprising a first etch stop layer positioned between the first insulating layer and the second insulating layer.

10. The semiconductor device of claim 7, further comprising a first stress region positioned between the first doped region and the second contact.

11. The semiconductor device of claim 7, wherein a porosity of the second insulating layer is between about 10% and about 50%, and the peak portion includes epitaxy silicon.

12. A semiconductor device, comprising:
a substrate;
a first well region positioned in the substrate;
a first isolation structure positioned in the first well region;
a second isolation structure and a third isolation structure respectively positioned adjacent to two sides of the first well region, wherein the first isolation structure and the second isolation structure define a first active area in the substrate, and the first isolation structure and the third isolation structure define a second active area in the substrate, wherein the second active area is opposite to the first active area with the first isolation structure interposed therebetween;

a peak portion positioned on the first active area;

a gate insulating layer positioned on the peak portion and the substrate;

a gate bottom conductive layer positioned on the gate insulating layer;

a doped region positioned in the second active area;

a first contact positioned above the gate bottom conductive layer; and a second contact positioned above the doped region.

13. The semiconductor device of claim 12, wherein the gate insulating layer comprises a capping portion positioned on the peak portion and two flat portions positioned adjacent to two sides of the capping portion and on the substrate, wherein a thickness of the two flat portions is greater than or equal to a thickness of the capping portion.

14. The semiconductor device of claim 13, wherein a depth of the first isolation structure is less than a depth of the second isolation includes epitaxy silicon.

* * * * *